US008421920B2

(12) United States Patent
Funada

(10) Patent No.: US 8,421,920 B2
(45) Date of Patent: Apr. 16, 2013

(54) AUTOMATIC QUANTIZATION CLOCK PHASE ADJUSTABLE DISPLAY APPARATUS

(75) Inventor: Masahiro Funada, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 122 days.

(21) Appl. No.: 13/013,297

(22) Filed: Jan. 25, 2011

(65) Prior Publication Data

US 2011/0181777 A1 Jul. 28, 2011

(30) Foreign Application Priority Data

Jan. 26, 2010 (JP) ................................. 2010-013789

(51) Int. Cl.
*H03L 7/00* (2006.01)
*G09G 5/00* (2006.01)

(52) U.S. Cl.
USPC .......................................... 348/537; 345/213

(58) Field of Classification Search .................. 348/537, 348/540, 194, 572, 511; 345/212, 213; 713/400; 353/69, 121, 122; 358/1.5, 3.26, 410, 412
See application file for complete search history.

(56) References Cited

U.S. PATENT DOCUMENTS

| | | | | | |
|---|---|---|---|---|---|
| 4,774,577 | A * | 9/1988 | Takimoto | ...................... | 348/537 |
| 4,905,085 | A * | 2/1990 | Faulhaber | ..................... | 348/537 |
| 5,717,469 | A * | 2/1998 | Jennes et al. | .................. | 348/571 |
| 5,771,077 | A * | 6/1998 | Jennes et al. | .................. | 348/571 |
| 5,777,686 | A * | 7/1998 | Jennes et al. | .................. | 348/537 |
| 5,835,155 | A * | 11/1998 | Jennes et al. | .................. | 348/536 |
| 6,340,993 | B1 | 1/2002 | Hasegawa et al. | | |
| 2002/0018038 | A1 * | 2/2002 | Onishi et al. | .................... | 345/98 |
| 2006/0066593 | A1 | 3/2006 | Anderson et al. | | |

FOREIGN PATENT DOCUMENTS

| | | | |
|---|---|---|---|
| EP | 0 961 261 | A1 | 12/1999 |
| JP | 11-177847 | A | 7/1999 |
| JP | 2000-122624 | A | 4/2000 |

OTHER PUBLICATIONS

Extended European Search Report issued in corresponding European Patent Application No. 11152145.6 dated Apr. 18, 2011.

* cited by examiner

*Primary Examiner* — Victor Kostak
(74) *Attorney, Agent, or Firm* — Rossi, Kimms & McDowell LLP

(57) ABSTRACT

The method adjusts the phase of a quantization clock signal for a video signal automatically based on a received analogue video signal. The method includes a step of determining a horizontal start position and a horizontal end position of a pixel-level transition within the analogue video signal, a step of determining a stable-period start position and a stable-period end position at each transition by sequentially changing an adjustable phase of the quantization clock signal, a step of calculating an appropriate phase of the quantization clock signal based on the determined timings of the beginning and end of the stable periods within the analogue signal, and a step of setting the phase of the quantization clock signal to the calculated appropriate phase.

16 Claims, 17 Drawing Sheets

AUTOMATIC QUANTIZATION CLOCK PHASE ADJUSTABLE DISPLAY APPARATUS

BACKGROUND OF THE INVENTION

1. Field of the Invention

The present invention relates to a display apparatus having an automatic quantization clock phase adjustment function, such as a projector and a monitor.

2. Description of the Related Art

Displaying an analog video signal showing documents, graphics and the like created by a computer on a display apparatus requires matching a quantization clock for the analog video signal and an effective image area of the analog video signal in the computer with those in the display apparatus. Such a display apparatus generally has a signal format table in which information on attributes of horizontal and vertical synchronization signals such as frequencies and polarities is correlated with the quantization clock and the effective image area. Reading such attributes of synchronization signals output from the computer enables discrimination of their signal formats.

The display apparatus normally generates the quantization clock needed for quantization of the analog video signal output from the computer by multiplication of the horizontal synchronization signal. An appropriate frequency of the quantization clock can be known from the above-described information of the synchronization signal. However, appropriate phases of the synchronization signals are different in respective computers. This is because the horizontal synchronization signal and the video signal output from the computer have a time difference, and the time differences are different in the respective computers.

Therefore, performing good quantization requires the display apparatus to have an automatic adjustment function of a phase of the quantization clock to compensate for the above-mentioned time difference. The phase of the quantization clock is hereinafter referred to as a “quantization clock phase” or a “clock phase”.

Japanese Patent Laid-Open No. 2000-122624 discloses an art relating to such automatic quantization clock phase adjustment. The disclosed art first detects video levels of an input analog video signal at a horizontal video start position (coordinates) and a horizontal video end position (coordinates) at each clock phase to combine the detected video levels at the same clock phase. This provides video level data that reflects a leading edge and a trailing edge of the input analog video signal. Then, the disclosed art regards a certain clock phase where the video level data becomes a maximum level as a stable phase where the video level is little changed, and fits the clock phase to be adjusted to the stable phase, thereby performing the automatic quantization clock phase adjustment.

On the other hand, Japanese Patent Laid-Open No. 11-177847 discloses the following art. The disclosed art first performs at each clock phase a process to obtain an absolute difference value of at least one pair of pixels adjacent to each other in one frame of an input video signal. Then, the disclosed art adjusts a frequency and a phase of the quantization clock such that the obtained absolute difference value becomes maximum.

However, the art disclosed in Japanese Patent Laid-Open No. 2000-122624 is based on a premise that levels of the leading edge and the trailing edge of the video signal respectively transit in a first half and a latter half of one quantization clock. Therefore, the disclosed art cannot be applied to a video signal that starts the level transitions of the leading edge and the trailing edge in an approximately same phase as shown in FIG. 13.

Moreover, the art disclosed in Japanese Patent Laid-Open No. 11-177847 is based on a premise that there are some image areas where an inclination of change of the video level is reversed at each pixel, and provides better adjustment accuracy as such image areas increase. Thus, in video signals often used for displaying presentation’s titles which include few image areas where the inclination of the change of the video level is reversed at each pixel, the absolute difference value of the adjacent pixels is less changed even if the frequency and phase of the quantization are adjusted, and therefore the art cannot perform correct quantization clock phase adjustment.

SUMMARY OF THE INVENTION

The present invention provides a display apparatus capable of performing automatic quantization clock phase adjustment for a video signal in which the levels of its leading and trailing edges transit in phases close to each other, and capable of improving accuracy of the automatic quantization clock phase adjustment for a case where the video signal includes few image areas where an inclination of video level change is reversed at each pixel.

The present invention provides as one aspect thereof a method of automatically adjusting a phase of a quantization clock signal for a video signal based on a received analogue video signal. The method includes a step of determining a horizontal start position and a horizontal end position of a pixel-level transition within the analogue video signal, a step of determining a stable-period start position and a stable-period end position at each transition by sequentially changing an adjustable phase of the quantization clock signal, a step of calculating an appropriate phase of the quantization clock signal based on the determined timings of the beginning and end of the stable periods within the analogue signal, and a step of setting the phase of the quantization clock signal to the calculated appropriate phase.

The present invention provides as another aspect thereof a processing apparatus for automatically adjusting a phase of a quantization clock signal for a video signal based on a received analogue video signal. The apparatus includes a first determining part configured to determine a horizontal start position and a horizontal end position of a pixel-level transition within the analogue video signal, a second determining part configured to determine a stable-period start position and a stable-period end position at each transition by sequentially changing an adjustable phase of the quantization clock signal, a calculating part configured to calculate an appropriate phase of the quantization clock signal based on the determined timings of the beginning and end of the stable periods within the analogue signal, and a setting part configured to set the phase of the quantization clock signal to the calculated appropriate phase.

Further features of the present invention will become apparent from the following description of exemplary embodiments with reference to the attached drawings.

DESCRIPTION OF THE PREFERRED EMBODIMENTS

Figure 1A:
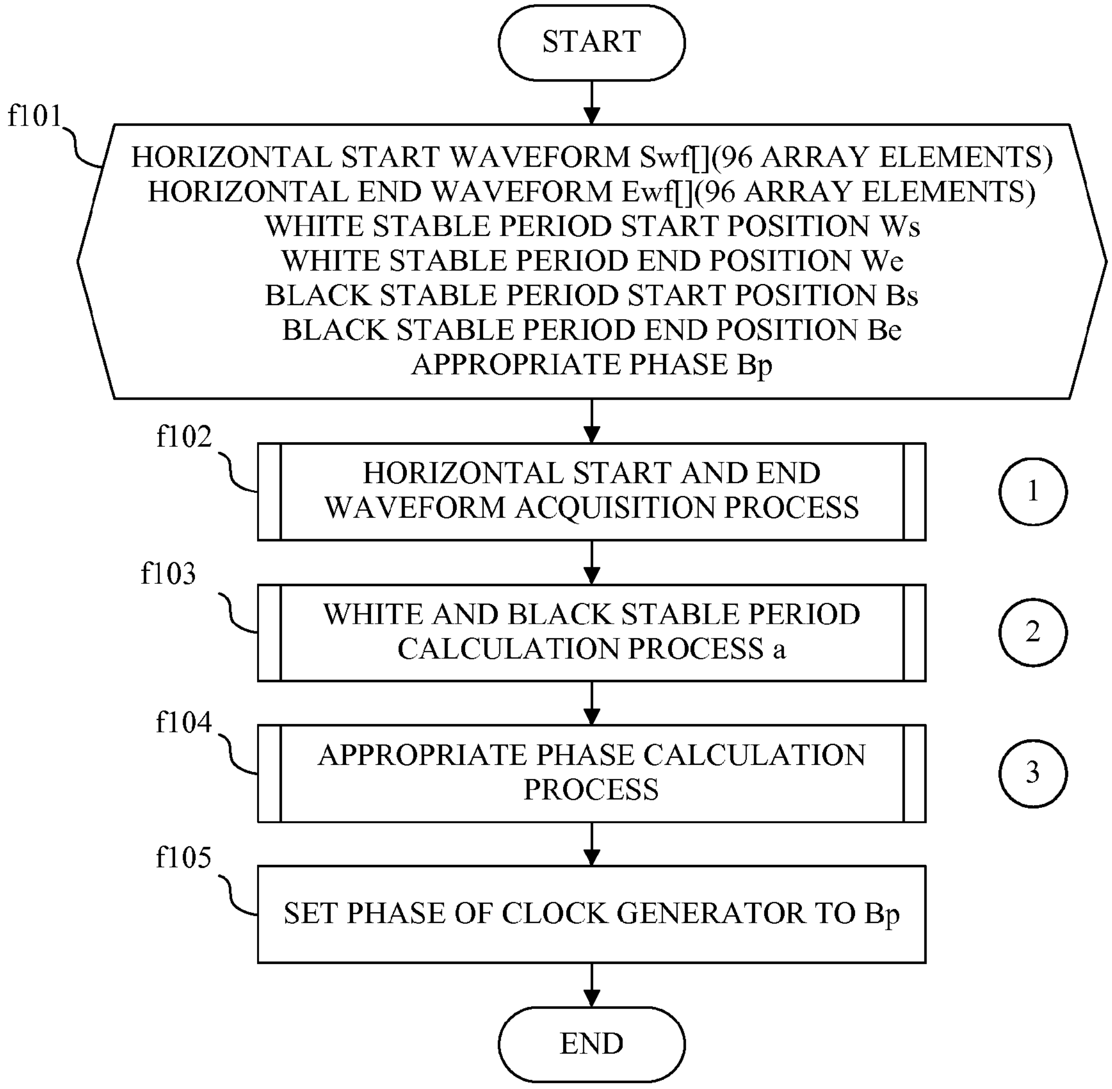
FIGS. 1A to 1D are flowcharts showing automatic quantization clock phase adjustment performed by a display apparatus that is Embodiment 1 of the present invention.

Exemplary embodiments of the present invention will hereinafter be described with reference to the accompanying drawings.

Embodiment 1

FIGS. 1 to 4 show a first embodiment (Embodiment 1) of the present invention. First, description will be made of a configuration of the display apparatus of this embodiment with reference to FIG. 2.

A controller 1 controls operations of respective parts in the display apparatus according to various computer programs stored in a memory 2.

A D-Sub15 pin terminal 3 is an input terminal for an RGB analog video signal from a video signal providing apparatus such as a computer.

A synchronization signal detector 4 performs determination of presence of horizontal and vertical synchronization signals, detection of a period of the horizontal synchronization signal and detection of a counted number of the horizontal synchronization signals in one period of the vertical synchronization signal (that is, a number of vertical lines). Moreover, the synchronization signal detector 4 outputs interrupt signals synchronizing with the vertical synchronization signal to the controller 1.

A clock generator 5 generates and outputs a quantization clock signal (hereinafter referred to as a "quantization clock") generated by multiplication of the horizontal synchronization signal, a factor of the multiplication being set by the controller 1. A phase of the quantization clock is also set by the controller 1. In this embodiment, the phase of the quantization clock can be variably set to, as an example, 32 steps from 0 to 31.

An AD converter 6 performs AD conversion of the analog video signal with the quantization clock output from the clock generator 5 to output an RGB digital video signal and a clock signal.

A horizontal start/end coordinates detector 7 detects start coordinates showing a start position of an effective image area in a video horizontal direction and a vertical position of the start position. The start coordinates, the start position and the effective image area are hereinafter respectively referred to as "horizontal start coordinates", a "horizontal start position" and a "horizontal effective area". Moreover, the horizontal start/end coordinates detector 7 detects end coordinates showing an end position of the horizontal effective image area and a vertical position of the end position. The end coordinates and the end position are hereinafter respectively referred to as "horizontal end coordinates" and a "horizontal end position". The horizontal start position and horizontal end position are determined on the basis of a threshold level set by the controller 1.

Specifically, the horizontal start/end coordinates detector 7 starts clock counting in response to input of the horizontal synchronization signal. Then, the detector 7 sets a position where the output value (that is, the value of the digital video signal) from the AD converter 6 first exceeds a predetermined threshold level in any channel of R, G and B as the horizontal start position. The detector 7 sets a position where the output value from the AD converter 6 last exceeds the threshold level as the horizontal end position. Then, the horizontal start/end coordinates detector 7 keeps holding the horizontal start position and the horizontal end position until a next vertical synchronization signal is input thereto. Moreover, the horizontal start/end coordinates detector 7 also starts counting of the horizontal synchronization signal in response to input of the vertical synchronization signal, and holds the vertical position at a time of last storing the horizontal start and end positions.

The horizontal start/end coordinates detector 7 resets the stored values in response to the input of the vertical synchronization signal, and outputs the horizontal and vertical coordinates of the horizontal start and end positions in a previous frame in response to an acquisition request from the controller 1.

A pixel level detector 8 detects, from the input RGB digital video signal, pixel levels of the R, G and B channels at the horizontal and vertical coordinates specified by the controller 1. The detected and stored values are updated at each frame. The pixel level detector 8 outputs the pixel level of the previous frame in response to an acquisition request from the controller 1.

A video signal processor 9 performs appropriate conversion processing on the RGB digital video signal to output the converted video signal to a displaying part (not shown), and thereby a video is displayed thereon.

Next, description will be made of an automatic adjustment function (automatic adjustment process) of the phase of the quantization clock to be set to the clock generator 5 by the controller 1 serving as a phase adjuster with reference to FIGS. 1A to 1D. The phase of the quantization clock to be set to the clock generator 5 is hereinafter referred to as a "quantization clock phase".

In a main routine shown in FIG. 1A, at step f101, the controller 1 defines various variables. A horizontal start waveform Swf[ ] and a horizontal end waveform Ewf[ ] which are level transition waveforms have an array including ninety six array elements, and store data indicating waveforms showing level transitions of the pixel level in ranges including and near the horizontal start position and the horizontal end position, respectively.

A white stable period start position (first phase) Ws stores a phase of a high-level transition that is a level transition from a low level (black level) corresponding to a first level to a high level (white level) corresponding to a second level higher than the first level is ended, in other words, a start phase of a signal stable period after the high-level transition. A white stable period end position (second phase) We stores an end phase of the signal stable period after the high-level transition, in other words, a phase where a low-level transition from the high level (second level) to the low level (first level) is started.

A black stable period start position (fourth phase) Bs stores a phase where the low-level transition is ended, in other words, a start phase of a signal stable period after the low-level transition. A black stable period end position (third phase) Be stores an end phase of the signal stable period after the low-level transition, in other words, a phase where the high-level transition is started. An appropriate phase Bp stores an appropriate quantization clock phase that is a phase as appropriate as possible or an optimum phase.

At step f102, the controller 1 performs a horizontal start and end waveform acquisition process (Subroutine 1), which will be described later, to acquire values of the horizontal start waveforms Swf[0] to Swf[95] and the horizontal end waveforms Ewf[0] to Ewf[95].

At step f103, the controller 1 performs a white and black stable period calculation process a (Subroutine 2), which will be described later, to calculate the white stable period start position Ws, the white stable period end position We, the black stable period start position Bs and the black stable period end position Be from the level transition waveforms acquired at step f102.

At step f104, the controller 1 performs an appropriate phase calculation process (Subroutine 3), which will be described later, to calculate the appropriate phase Bp from the positions acquired at step f103.

At step f105, the controller 1 sets the appropriate phase Bp to the clock generator 5, and then ends this process.

Figure 1B:
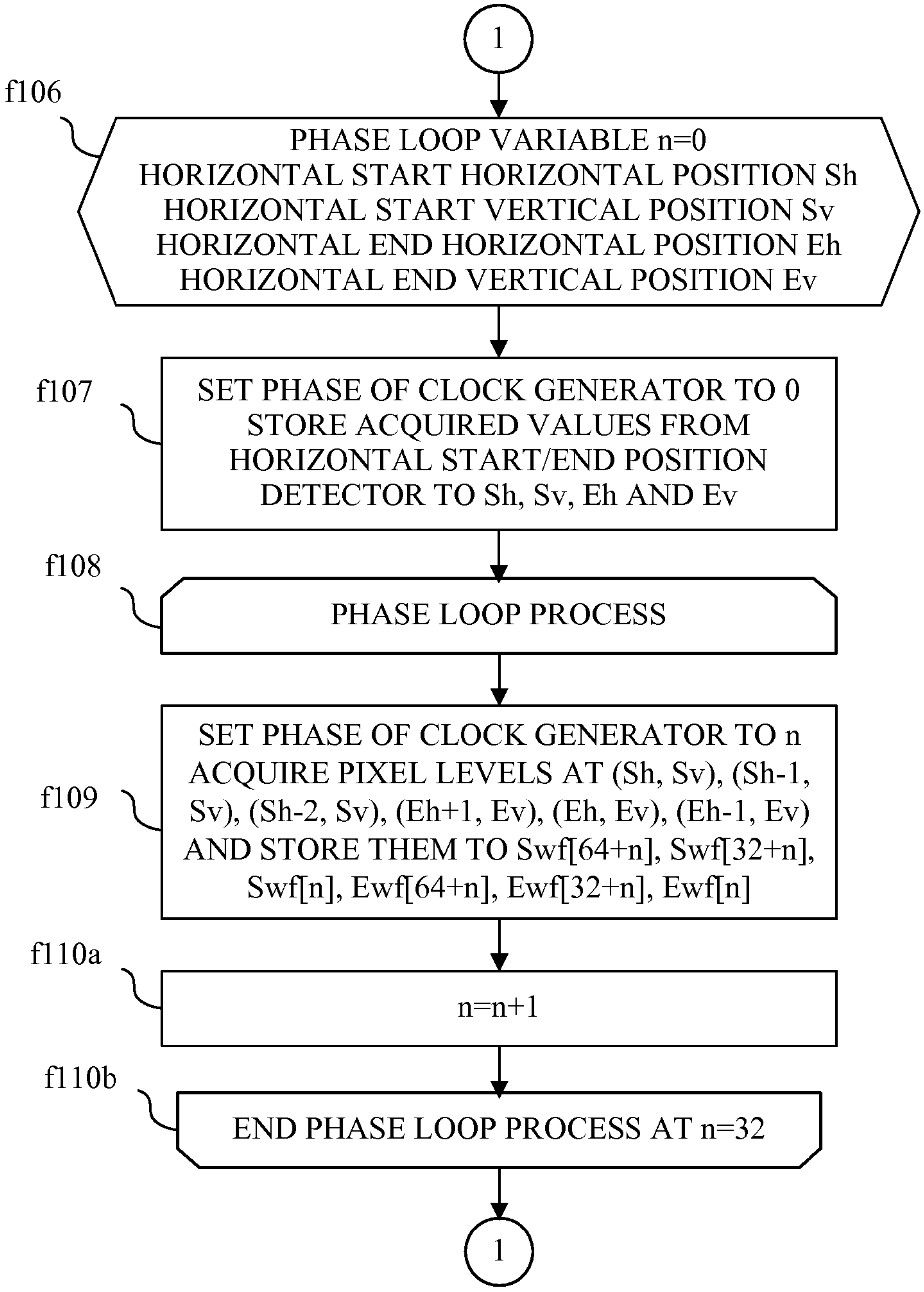

Detailed description will be made of operations in the horizontal start and end waveform acquisition process (Subroutine 1) with reference to FIG. 1B.

At step f106, the controller 1 defines various variables. A phase loop variable n is a loop variable, which is also used as a value of an adjustable phase to be set to the clock generator 5. A horizontal start horizontal position Sh and a horizontal start vertical position Sv respectively store the horizontal start position and the vertical position at which the horizontal start position is stored, which are acquirable from the horizontal start/end coordinates detector 7. Similarly, a horizontal end horizontal position Eh and a horizontal end vertical position Ev respectively store the horizontal end position and the vertical position at which the horizontal end position is stored, which are acquirable from the horizontal start/end coordinates detector 7.

At step f107, the controller 1 sets the phase of the clock generator 5 to 0. Then, the controller 1 waits a time corresponding to at least two vertical synchronization interrupt signals output from the synchronization signal detector 4 as a time until the phase setting is reflected to the output of the horizontal start/end position coordinates detector 7, and thereafter acquires, from the horizontal start/end position coordinates detector 7, the horizontal start position, the horizontal end position and the vertical positions at which the horizontal start and end positions are stored. Furthermore, the controller 1 stores the values of the horizontal start position, the horizontal end position and the vertical positions to the horizontal start horizontal position Sh, the horizontal end horizontal position Eh, the horizontal start vertical position Sy and the horizontal end vertical position Ev.

At steps f108 to f110*b*, the controller 1 performs a phase loop process. In this process, the controller 1 sequentially increases the phase loop variable n 1 by 1 at step f110*a* after a process at step f109 is ended. At step f110*b*, the controller 1 ends this phase loop process when the phase loop variable n reaches 32.

In the phase loop process, at step f109, the controller 1 sets the phase of the clock generator 5 to n, and waits the time corresponding to at least two vertical synchronization interrupt signals output from the synchronization signal detector 4 as a time until the set phase n is reflected to the output of the pixel level detector 8. Afterwards, the controller 1 acquires, from the pixel level detector 8, pixel levels at coordinates (Sh, Sv), (Sh−1, Sv), (Sh−2, Sv), (Eh+1, Ev), (Eh, Ev) and (Eh−1, Ev). Then, the controller 1 stores the acquired pixel levels at the coordinates (Sh, Sy), (Sh−1, Sy), (Sh−2, Sy), (Eh+1, Ev), (Eh, Ev) and (Eh−1, Ev) to Swf[64+*n*], Swf[32+*n*], Swf[n], Ewf[64+*n*], Ewf[32+*n*] and Ewf[n], respectively.

Thus, the controller 1 as the phase adjuster sequentially changes the phase loop variable (adjustable phase) n of the quantization clock to cause the pixel level detector 8 to detect the pixel level sequentially in areas including the horizontal start coordinates and the horizontal end coordinates. Then, the controller 1 acquires the level transition waveforms with respect to the quantization clock phase in predetermined ranges respectively including the horizontal start position and the horizontal end position (that is, ranges in the vicinity of the horizontal start and end positions).

Figure 3:
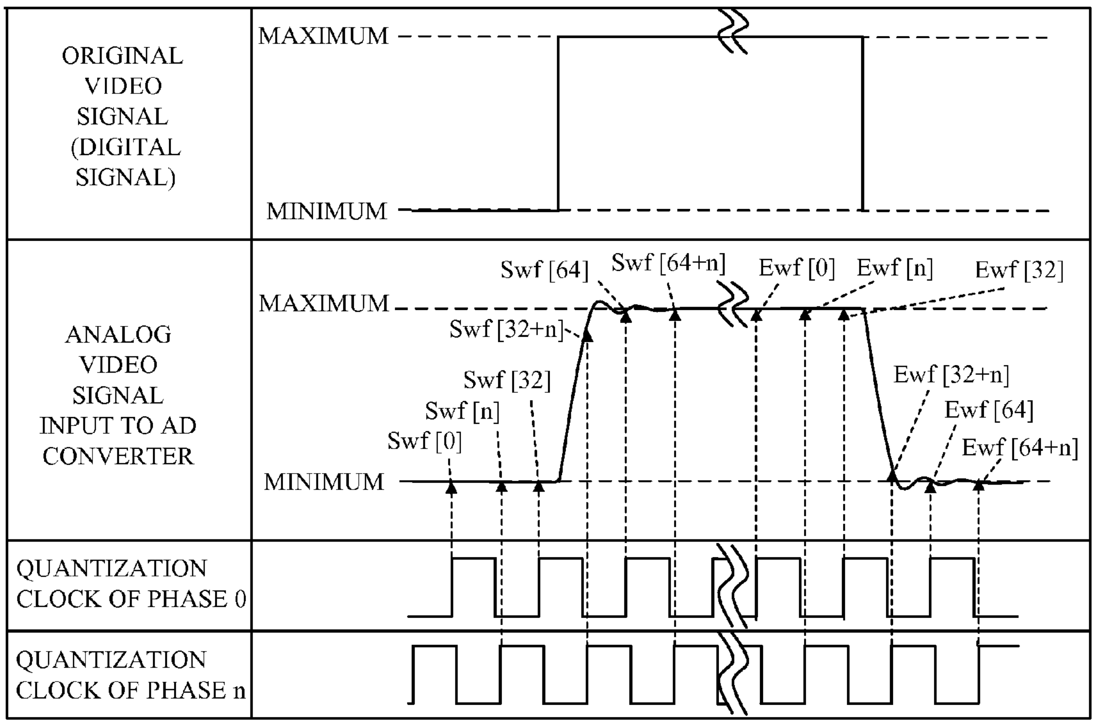
FIG. 3 shows a pixel level acquisition image in a phase loop process in Embodiment 1.
Figure 4A:
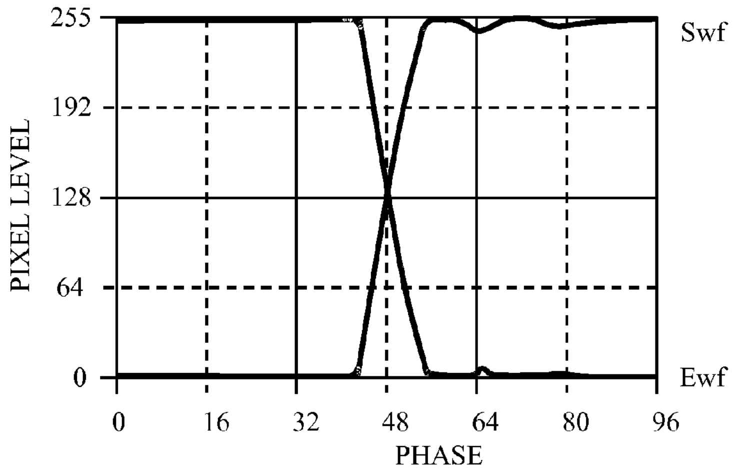
FIG. 4A shows an example of horizontal start and end waveforms acquired in the phase loop process in Embodiment 1.

FIG. 3 shows a relationship between the original analog video signal and the pixel level acquired by the phase loop process. When the phase loop process is ended to n=31, the level transitions in three quantization clock periods as shown in FIG. 4A are stored to Swf[0] to Swf[95] for the horizontal start positions, and stored to Ewf[0] to Ewf[95] for the horizontal end positions. The reason to acquire the pixel levels in the three quantization clock periods is to reliably acquire a start point and an end point of the transition without depending on a relationship among the analog video signal, threshold values of the horizontal start/end coordinates detector 7 and the quantization clock for n=0.

Figure 1C:
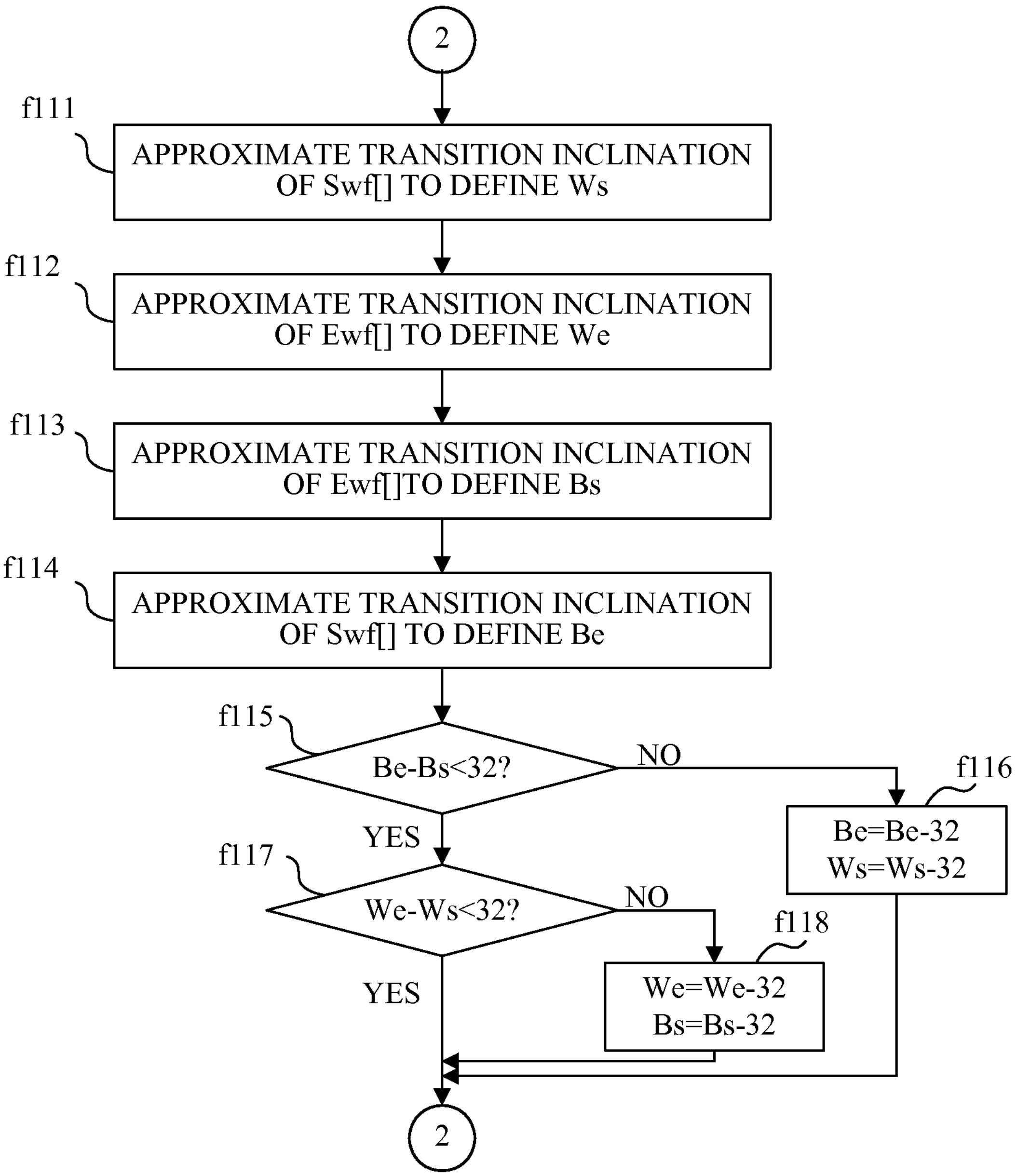

Next, detailed description will be made of operations in the white and black stable period calculation process a (Subroutine 2) with reference to FIG. 1C. This calculation process a corresponds to a first phase calculation process, a second phase calculation process, a third phase calculation process and a fourth phase calculation process.

The following description is based on a premise that phases where the transition from the black level (first level) to the high level (second level) is started and ended and phases where the transition from the high level to the black level is started and ended do not significantly increase (extend) with respect to a phase where a transition from any one level to any other level is started and ended. In other words, phases where any level transition is started and ended can be substituted by the phases for the transition of the horizontal start waveform Swf[ ] or of the horizontal end waveform Ewf[ ] which is acquired by the previous process at step f102.

Description will hereinafter be made of the white and black stable period calculation process for calculating the white stable period start position Ws, the white stable period end position We, the black stable period start position Bs and the black stable period end position Be from the horizontal start waveform Swf[ ] and the horizontal end waveform Ewf[ ] with reference to FIG. 1C.

Figure 4B:
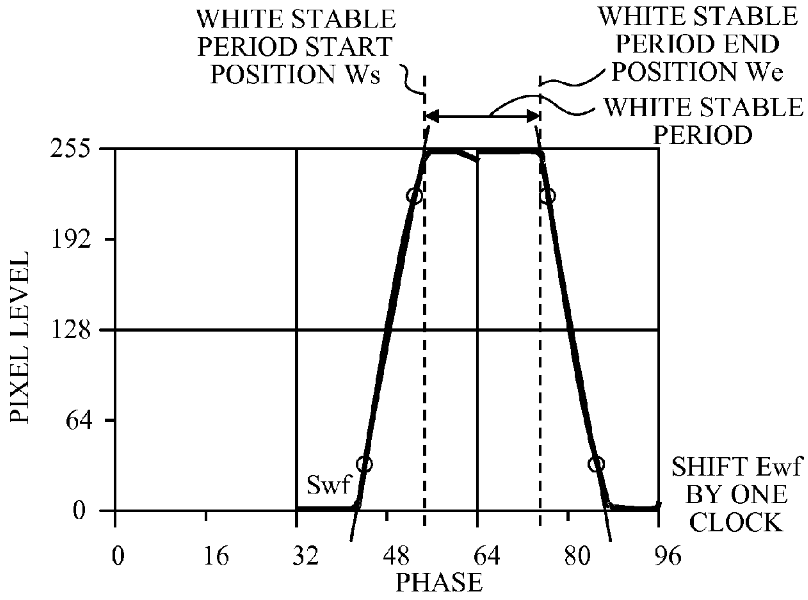
FIG. 4B shows an example of a transited waveform indicating a white stable period in Embodiment 1.

At step fill, as shown in FIG. 4B, the controller 1 approximates a transition inclination with a straight line connecting two points (shown by circles in the figure) corresponding to 1/8 and 7/8 of the horizontal start waveform Swf[ ] after start of its level transition, and defines a phase where the straight line intersects with a maximum level as the white stable period start position Ws.

At step f112, the controller 1 approximates a transition inclination with a straight line connecting two points corresponding to 7/8 and 1/8 of the horizontal end waveform Ewf[ ] after start of its level transition, and defines a value obtained by adding 32 that is a phase period corresponding to one clock, based on a relationship with the white stable period start position Ws, to a phase where the straight line intersects with the maximum level as the white stable period end position We. FIG. 4B shows a white stable period from the white stable period start position Ws to the white stable period end position We.

Figure 4C:
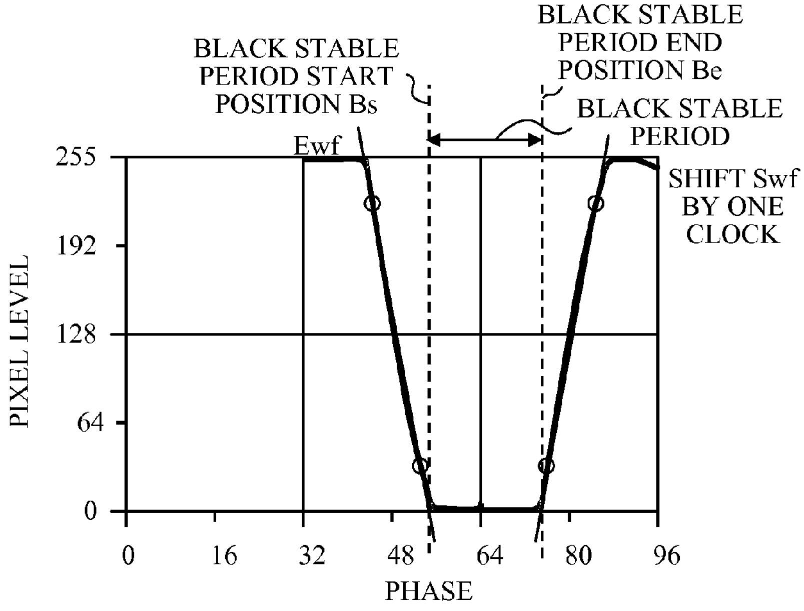
FIG. 4C shows an example of a transited waveform indicating a black stable period in Embodiment 1.

At step f113, as shown in FIG. 4C, the controller 1 approximates a transition inclination with the straight line connecting the two points corresponding to 7/8 and 1/8 of the horizontal end waveform Ewf[ ] after the start of its level transition, and defines a phase where the straight line intersects with the black level as the black stable period start position Bs.

At step f114, the controller 1 approximates a transition inclination with the straight line connecting the two points corresponding to 1/8 and 7/8 of the horizontal start waveform Swf[ ] after the start of its level transition, and defines a value obtained by adding 32 corresponding to one clock, based on a relationship with the black stable period start position Bs, to a phase where the straight line intersects with the black level as the black stable period end position Be. FIG. 4C shows a black stable period from the black stable period start position Bs to the black stable period end position Be.

The above description was made assuming that the transition has ended when the phase is 0. However, if the transition is being continued when the phase is 0, there may exist a case where anteroposterior relationships of the transitions around the horizontal start coordinates and the horizontal end coordinates acquired at step f107 do not match each other. In order to compensate such a state, the controller 1 corrects the respective stable period start and end positions at steps f115 to f118.

At step f115, the controller 1 determines whether or not the black stable period (Be-Bs) is within one clock (32). When determining that the black stable period is not within one clock, the controller 1 proceeds to step f116 to shift the black stable period end position Be and the white stable period start position Ws calculated from the horizontal start waveform Swf[ ] by a shift amount corresponding to one clock. On the other hand, when determining that the black stable period (Be-Bs) is within one clock at step f115, the controller 1 moves to the following white stable period confirmation process.

At step f117, the controller 1 determines whether or not the white stable period (We-Ws) is within one clock (32). When determining that the white stable period is not within one clock, the controller 1 proceeds to step f118 to shift the white stable period end position We and the black stable period start position Bs calculated from the horizontal end waveform Ewf[ ] by the shift amount corresponding to one clock.

Next, detailed description will be made of the appropriate phase calculation process (Subroutine 3) including an overlap period calculation process with reference to FIG. 1D.

At step f119, the controller 1 defines various variables. The controller 1 respectively stores a start position and an end position of an overlap period of the white stable period and the black stable period to an overlap stable period start position (overlap period start phase) Os and an overlap stable period end position (overlap period end phase) Oe.

In a part of the overlap period calculation process at steps f120 to f122, the controller 1 substitutes a value (phase) showing the more posterior one of the black stable period start position (fourth phase) Bs and the white stable period start positions (first phase) Ws into the overlap stable period start position Os.

In another part of the overlap period calculation process at steps f123 to f125, the controller 1 substitutes a value (phase) of the more anterior one of the black stable period end position (third phase) Be and the white stable period end position (second phase) We into the overlap stable period end position Oe.

At step f126, the controller 1 calculates a phase included in an overlap stable period (phase period) between the overlap stable period start position Os and the overlap stable period end position Oe. The phase included in the overlap stable period in this embodiment is a midpoint of the overlap stable period. Then, the controller 1 stores (sets) a remainder of division of (Os+Oe)/2 by the phase period of 32 corresponding to one clock to the appropriate phase Bp of the quantization clock.

The above description was based on the premise that there exist the white stable period and the black stable period. However, in a video format using a high-frequency clock, there may be a case where a level transition does not complete within one clock, that is, no stable period exists. The appropriate phase calculation process (Subroutine 3) can be applied as it is to such a case, and in this case a position where the level transition is most progressed is set as the appropriate phase.

The above-described automatic quantization clock phase adjustment enables good quantization in the stable period after completion of each of the transitions from the black level to the high level and from the high level to the black level.

Although this embodiment used straight-line approximation between two points in the white and black stable period calculation process a (Subroutine 2), other approximation methods may be used.

Moreover, although this embodiment described the case of setting the midpoint of the phase period between the start and end positions of the overlap stable period as the appropriate phase in the appropriate phase calculation process (Subroutine 3), the appropriate phase may be any position in the phase period as long as the phase period has a sufficient margin.

Embodiment 2

Figure 5:
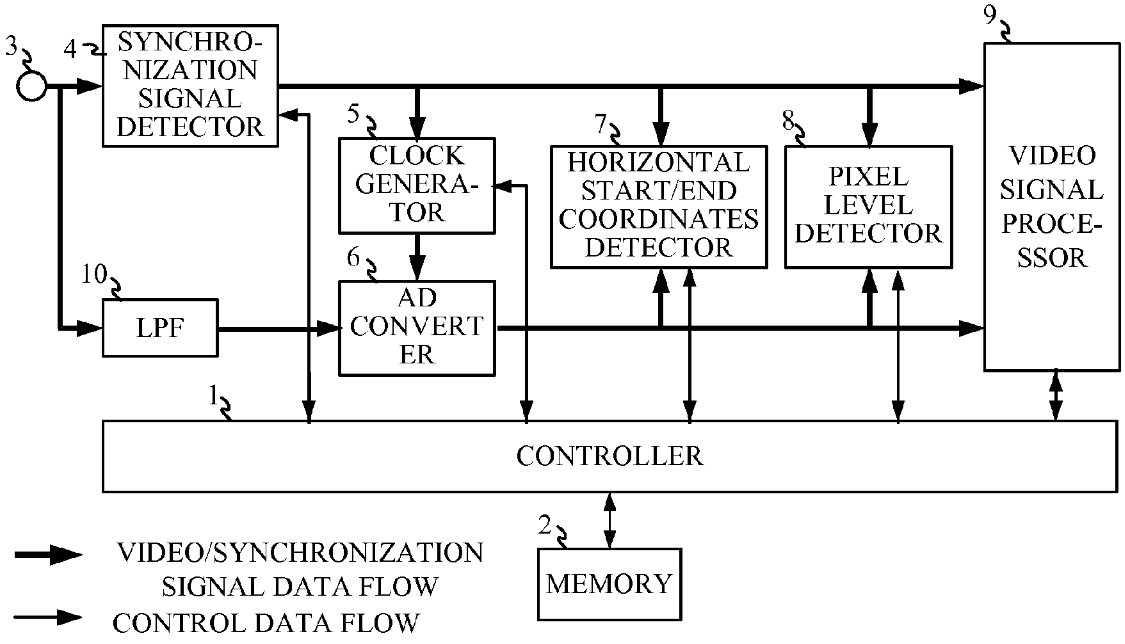
FIG. 5 is a block diagram showing a configuration of a display apparatus that is Embodiment 2 of the present invention.
Figure 6:
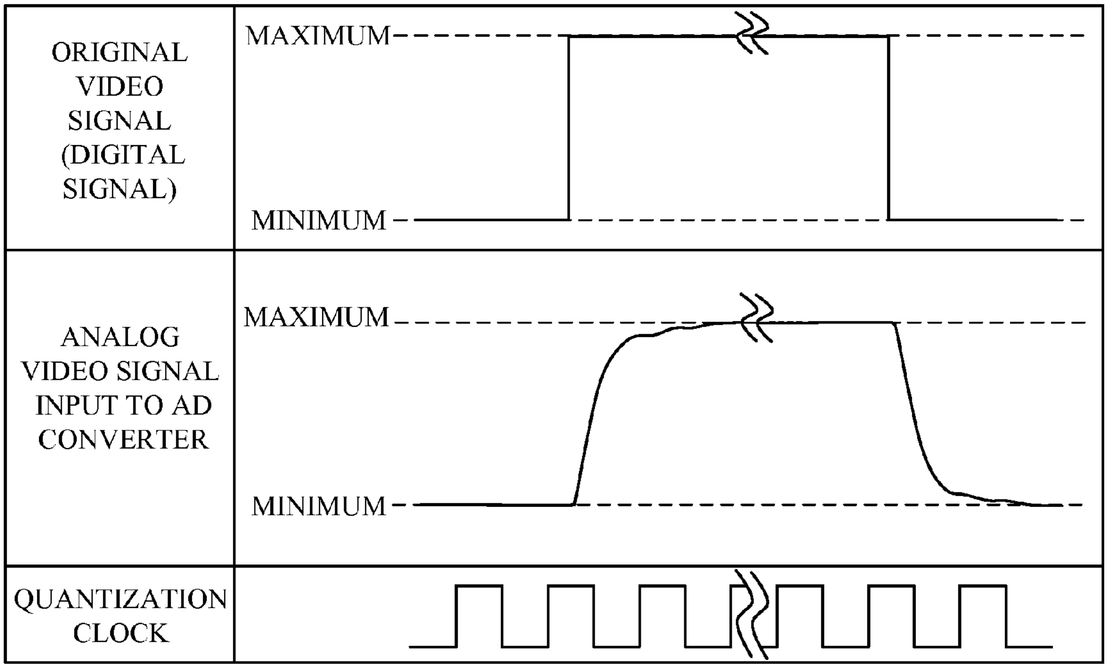
FIG. 6 shows an example of an analog video signal input to an AD converter in Embodiment 2.

FIGS. 5 to 7 show a second embodiment (Embodiment 2) of the present invention. First, description will be made of a configuration of the display apparatus of this embodiment with reference to FIG. 5. The configuration of this display apparatus is different from that of the display apparatus of Embodiment 1 in that an LPF (low-pass filter) 10 is added in front of the AD converter 6.

The LPF 10 performs a low-pass filter process to attenuate a high-frequency noise component included in the RGB analog video signal. The LPF 10 includes two or more filters whose frequency characteristics are different from each other and which are selectable by the controller 1. Other configurations are similar to those of Embodiment 1, and therefore their description is omitted.

Next, description will be made of an automatic quantization clock phase adjustment process in this embodiment. The automatic quantization clock phase adjustment process in this embodiment is basically same as that in Embodiment 1. However, the addition of the LPF 10 makes a method of calculating the appropriate phase Bp different from that used at step f126 in FIG. 1.

Figure 7A:
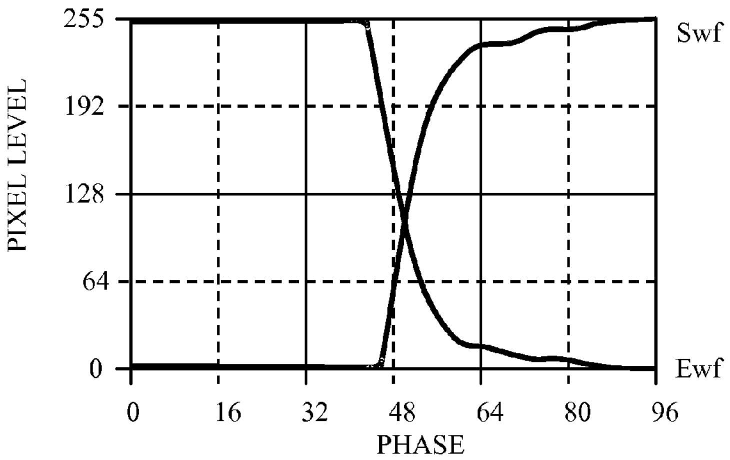
FIG. 7A shows an example of horizontal start and end waveforms acquired in a phase loop process in Embodiment 2.
Figure 7B:
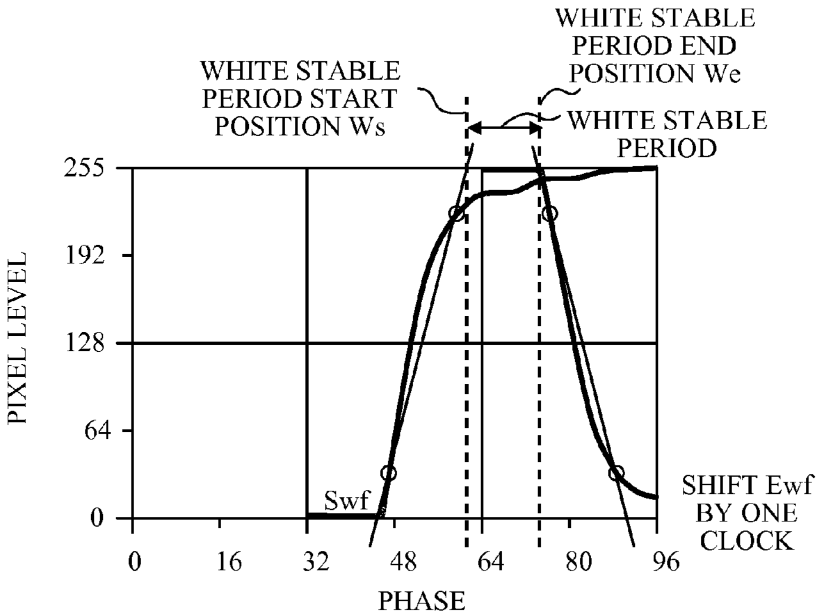
FIG. 7B shows an example of a transited waveform indicating a white stable period in Embodiment 2.
Figure 7C:
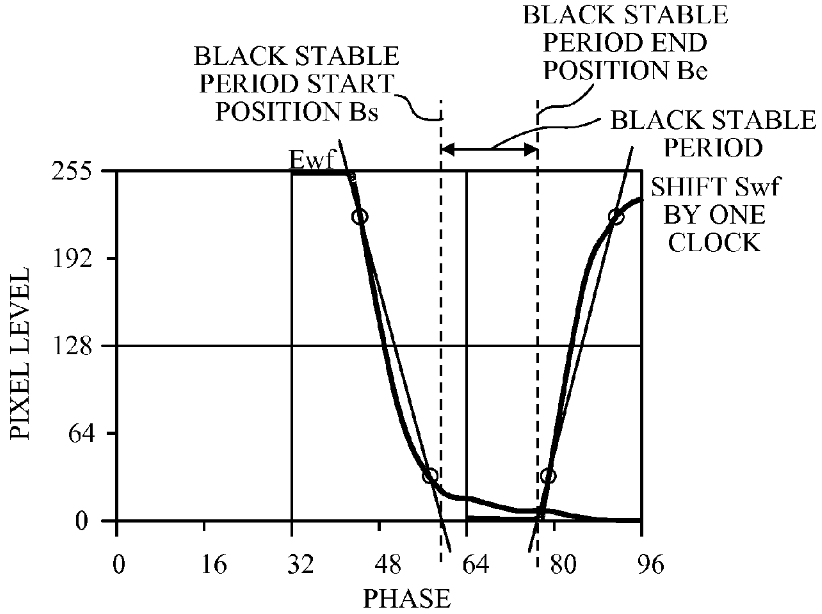
FIG. 7C shows an example of a transition waveform indicating a black stable period in Embodiment 2.
Figure 8:
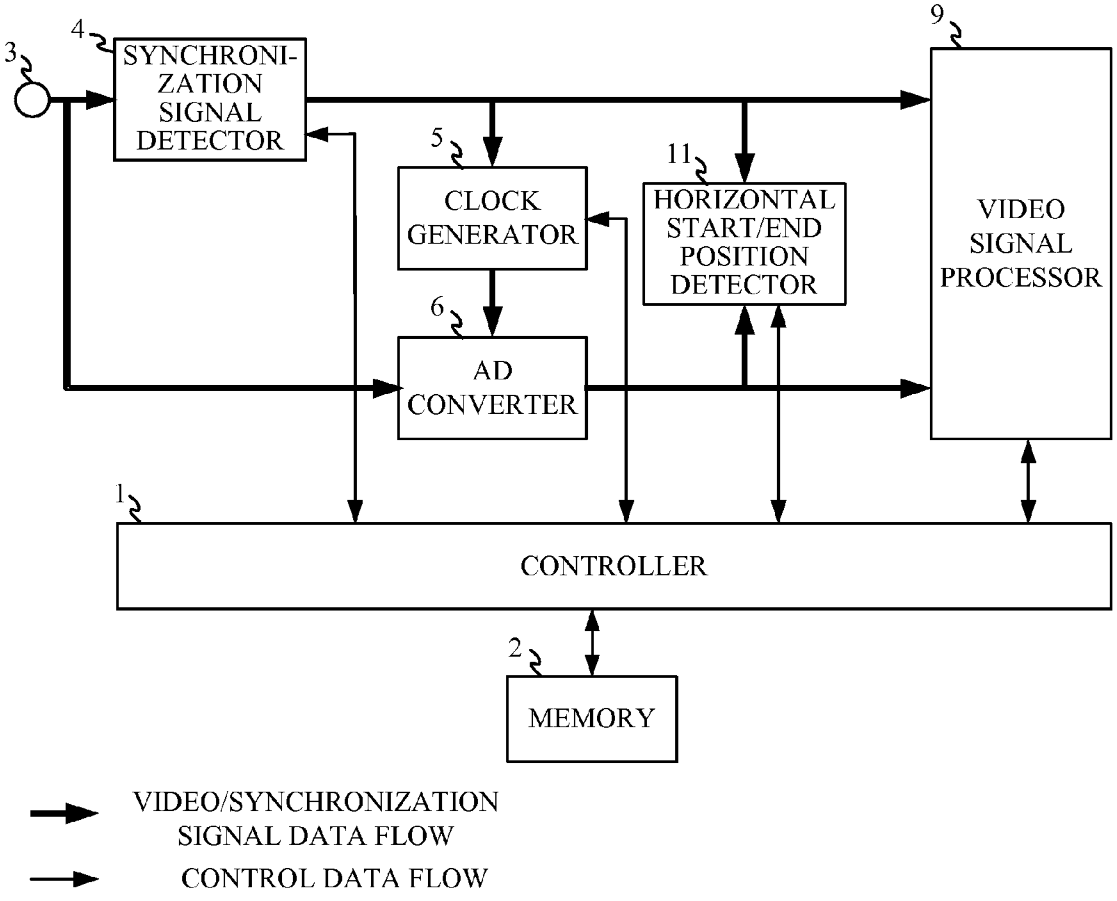
FIG. 8 is a block diagram showing a configuration of a display apparatus that is Embodiment 3 of the present invention.

As shown in FIG. 6, the low-pass filter process by the LPF 10 provides high-frequency noise tolerance, but attenuates a high-frequency component of the analog video signal. As a result, the horizontal start and end waveforms become as shown in FIG. 7A, and the white and black stable periods respectively become as shown in FIGS. 7B and 7C. As understood from these figures, in a video whose pixel level transits frequently, the levels of the horizontal start and end waveforms become closer to that of the original analog video signal toward the end positions We and Be of the white and black stable periods. Thus, this embodiment changes the method of calculating the appropriate phase Bp at step f126 shown in FIG. 1D as shown by the following expression so as to bring the appropriate phase Bp closer to the overlap stable period end position Oe. $Bp=\{(Os+Oe)/2\}+\{(Oe-Os)/2\}[3/\{(2\cdot\text{cutoff frequency}/\text{clock frequency})+3\}]$ The attenuated component in the analog video signal further increases as a cutoff frequency of the LPF 10 is brought closer to a frequency of the quantization clock (clock frequency). Therefore, this embodiment brings the phase of the quantization clock closer to the overlap stable period end position (that is, an end of the overlap stable period) as the cutoff frequency is closer to the clock frequency. This makes it possible to obtain a signal close to the original video signal, which enables better quantization.

Although this embodiment described the case where the appropriate phase is set to a position corresponding to 3/4 of the overlap stable period when the division of the cutoff frequency by the clock frequency gives 1.5, other settings may be used.

Embodiment 3

FIGS. 8 to 12 show a third embodiment (Embodiment 3) of the present invention. First, description will be made of a configuration of the display apparatus of this embodiment with reference to FIG. 8. The configuration of the display apparatus of this embodiment is different from that of Embodiment 1 in that it does not include the pixel level detector 8 and a horizontal start/end position detector 11 is provided in place of the horizontal start/end coordinates detector 7. Other configurations are similar to those of Embodiment 1, and therefore their description is omitted.

The horizontal start/end position detector 11 serving as a horizontal start position detector and a horizontal end position detector detects a start position of an effective image area in a video horizontal direction (horizontal effective area) and an end position thereof. Those start position and end position are determined on the basis of a threshold level set by the controller 1. The start position and the end position are hereinafter referred to as a "horizontal start position" and a "horizontal end position". The threshold level can be set to 1/8, 2/8, . . . , or 8/8 with respect to a white level.

The horizontal start/end position detector 11 starts clock counting in response to input of the horizontal synchronization signal. Then, the detector 11 sets a position where the output value (that is, the value of the digital video signal) from the AD converter 6 first exceeds the threshold level in any channel of RGB as the horizontal start position, and sets a position where the output value from the AD converter 6 last exceeds the threshold level as the horizontal end position.

The horizontal start/end position detector 11 keeps holding a minimum value at the horizontal start position and a maximum value at the horizontal end position until a next vertical synchronization signal is input thereto.

The horizontal start/end position detector 11 resets the held value in response to input of the vertical synchronization signal, and outputs the horizontal start and end positions in a previous frame in response to an acquisition request from the controller 1. The horizontal start/end position detector 11 outputs 0 when there exists no pixel whose level (pixel level) exceeds the threshold level.

Next, description will be made of an automatic quantization clock phase adjustment process in this embodiment with reference to FIGS. 9A to 9D.

Figure 9A:
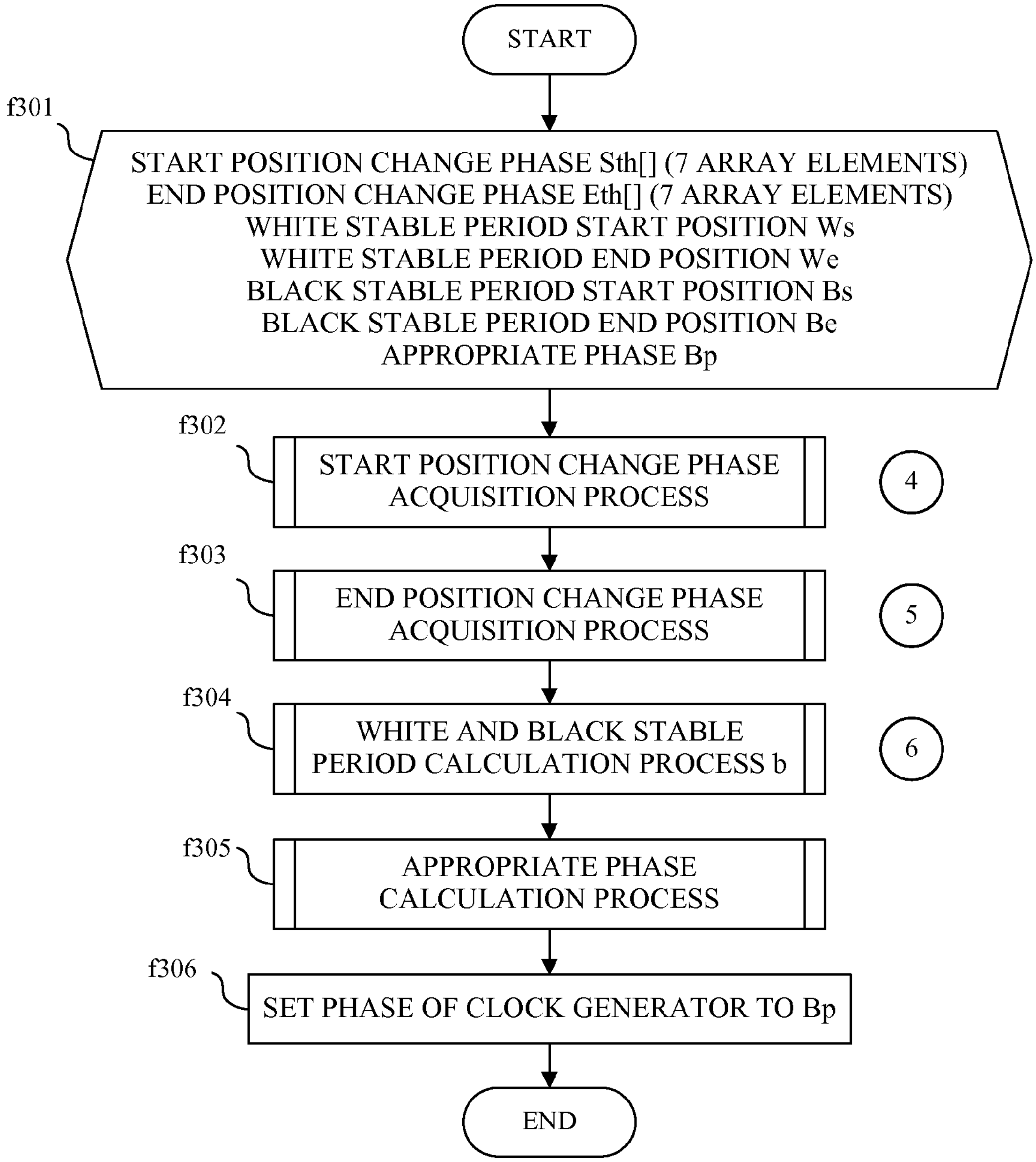
FIGS. 9A to 9D are flowcharts showing automatic quantization clock phase adjustment performed by a display apparatus in Embodiment 3.

In a main routine shown in FIG. 9A, at step f301, the controller 1 defines various variables. A start position change phase Sth[ ] has an array including seven array elements, and stores a start position change phase at which the horizontal start position detected by the horizontal start/end position detector 11 for each threshold level changes between consecutive phases. An end position change phases Eth[ ] has an array including seven array elements, and stores an end position change phase at which the horizontal end position detected by the horizontal start/end position detector 11 for each threshold level changes between consecutive phases.

The controller 1 stores values similar to those in Embodiment 1 to the white stable period start position Ws, the white stable period end position We, the black stable period start position Bs, the black stable period end position Be and the appropriate phase Bp.

At step f302, the controller 1 performs a start position change phase acquisition process (Subroutine 4), which will be described below, to acquire values of the start position change phases Sth[0] to Sth[6].

At step f303, the controller 1 performs an end position change phase acquisition process (Subroutine 5), which will be described below, to acquire values of the end position change phases Eth[0] to Eth[6].

At step f304, the controller 1 performs a white and black stable period calculation process b (Subroutine 6), which will be described below, to calculate the white stable period start position Ws, the white stable period end position We, the black stable period start position Bs and the black stable period end position Be.

Figure 1D:
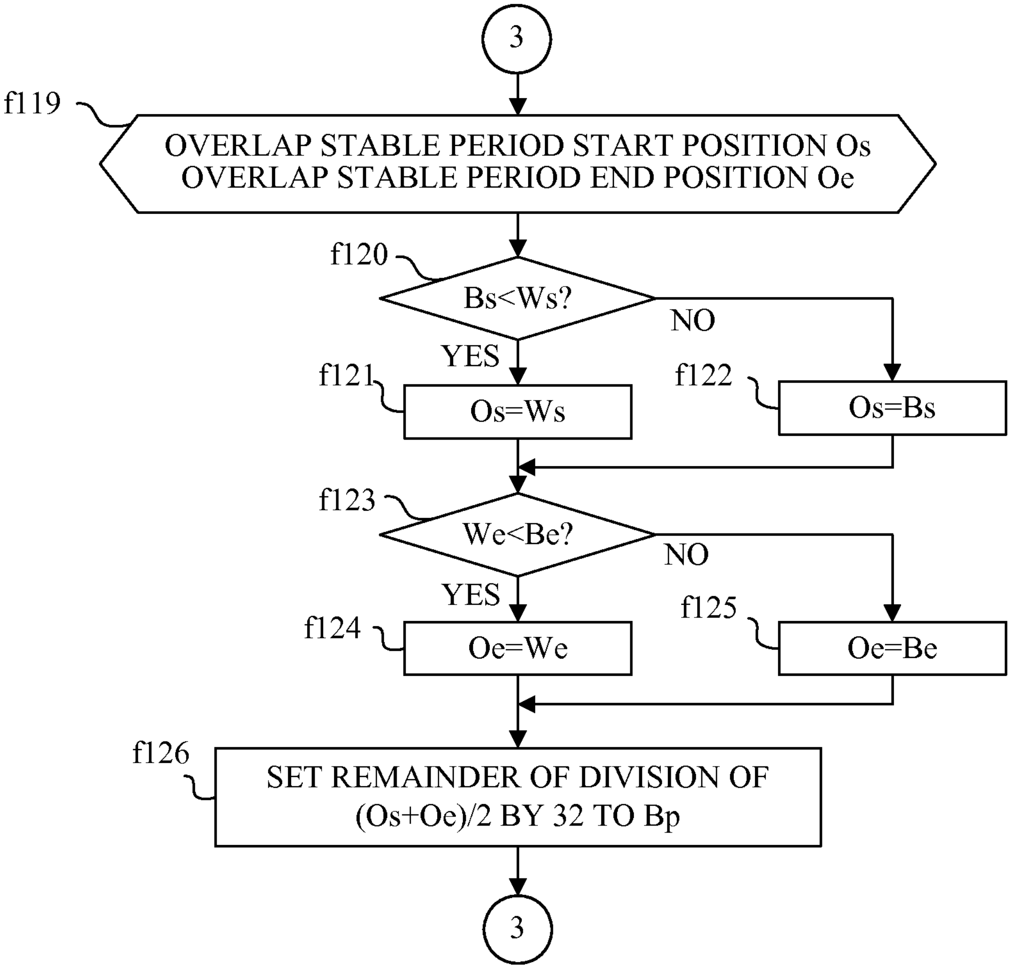
Figure 2:
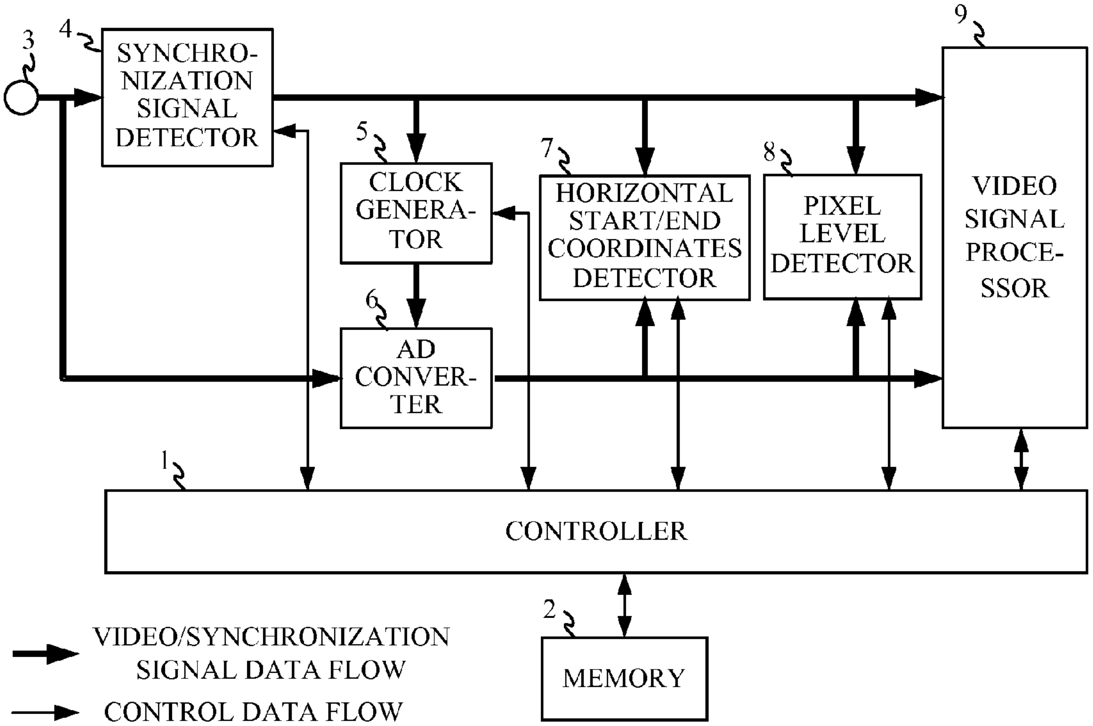
FIG. 2 is a block diagram showing a configuration of the display apparatus of Embodiment 1.

At step f305, the controller 1 performs an appropriate phase calculation process, which is the same process as Subroutine 3 shown in FIG. 1D, to calculate the appropriate phase Bp from the stable period start and end positions acquired by the previous process (step f304).

At step f306, the controller 1 sets the appropriate phase Bp to the clock generator 5, and then ends this process.

Figure 9B:
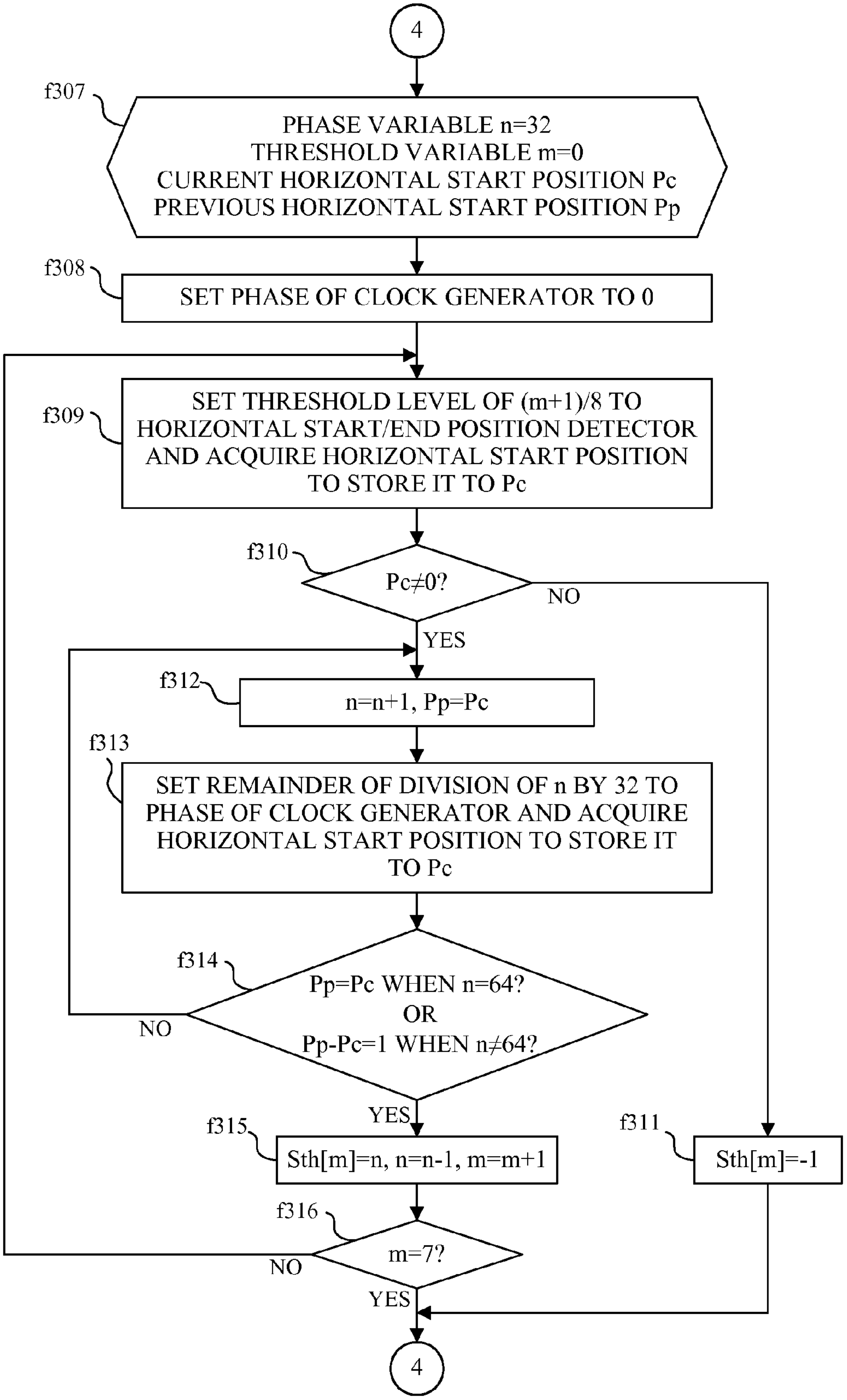

Detailed description will be made of operations in the start position change phase acquisition process (Subroutine 4) with reference to FIG. 9B.

At step f307, the controller 1 as a threshold level adjuster defines various variables. A phase variable (adjustable phase) n is a variable for managing the phase set to the clock generator 5, and its initial value is 32 corresponding to one clock. A threshold variable m is a variable for managing the threshold level set to the horizontal start/end position detector 11, and its initial value is 0. A current horizontal start position Pc stores the horizontal start position acquired from the horizontal start/end position detector 11 at the current phase setting. A previous horizontal start position Pp stores the horizontal start position acquired from the horizontal start/end position detector 11 at the previous phase setting.

At step f308, the controller 1 sets the phase of the clock generator 5 to 0.

At step f309, the controller 1 sets a value of the threshold level of (m+1)/8 to the horizontal start/end position detector 11. Then, the controller 1 waits a time corresponding to at least two vertical synchronization interrupt signals output from the synchronization signal detector 4 as a time until the threshold level setting is reflected to the output of the horizontal start/end position detector 11, and thereafter acquires the horizontal start position and stores it to the current horizontal start position Pc.

At step f310, the controller 1 determines whether or not the current horizontal start position Pc is other than 0. If determining that the current horizontal start position Pc is 0, the controller 1 proceeds to step f311. At step f311, the controller 1 stores −1 showing that there exists no pixel whose level exceeds the threshold level to the start position change phase Sth[m]. On the other hand, if determining that the current horizontal start position Pc is other than 0, the controller 1 proceeds to step f312 to perform a process for detecting a phase at which the horizontal start position changes while sequentially changing the phase.

At step f312, the controller 1 increases n by 1 in order to acquire the horizontal start position at a next set phase, and then copies the current horizontal start position Pc to the previous horizontal start position Pp.

At step f313, the controller 1 sets a remainder of division of n by 32 to the phase of the clock generator 5, and then acquires the horizontal start position from the horizontal start/end position detector 11 after waiting the time corresponding to at least two vertical synchronization interrupt signals output from the synchronization signal detector 4 as the time until the threshold level setting is reflected to the output of the horizontal start/end position detector 11. Then, the controller 1 stores the acquired horizontal start position to the current horizontal start position Pc.

Figure 10:
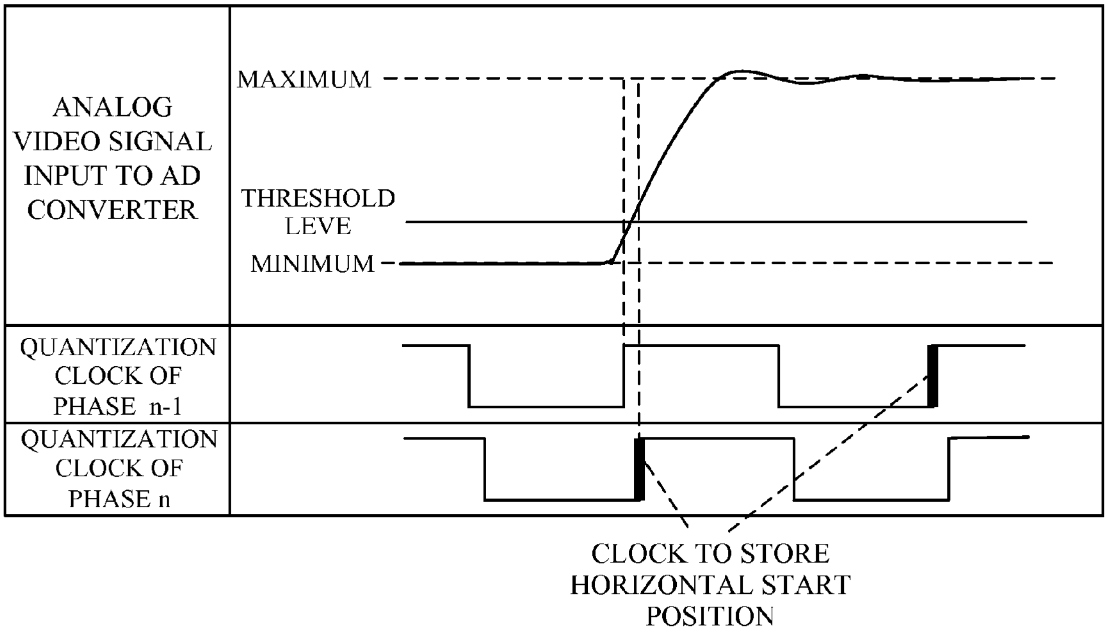
FIG. 10 shows an example of detection of a start position change phase in Embodiment 3.

At step f314, the controller 1 determines whether or not Pp is equal to Pc when n is 64 or whether or not Pp-Pc is equal to 1 when n is other than 64. If both these conditions are not satisfied, the controller 1 returns to step f312 to keep searching for a value of n satisfying any one of these conditions. These conditions are conditions for determining whether or not the analog input video signal reaches the threshold level between the phases respectively set when the phase variables are n and n−1 as shown in FIG. 10. The reason why the phase for n=64 is treated separately from other phases is that the phase corresponds to a clock change point in response to which the horizontal start/end position detector 11 starts clock counting. If any one of the conditions is satisfied at step f314, the controller 1 proceeds to step f315.

At step f315, the controller 1 stores a current value of n to Sth[m], and decreases n by 1 and increases m by 1 in order to acquire the start position change phase at a next threshold level. The reason why n is decreased by 1 is to prepare start of the start position change phase acquisition process at the next threshold level from n.

At step f316, the controller 1 determines whether or not the start position change phase acquisition process has been performed to a maximum threshold level. If it has not been performed to the maximum threshold level yet, the controller 1 returns to step f309 to perform the start position change phase acquisition process at the next threshold level. According to the above-described process, in the transition of the analog video signal from the low level to the high level, the phases at which the analog video signal rises to at least two threshold levels are stored to the start position change phase Sth[ ].

Figure 9C:
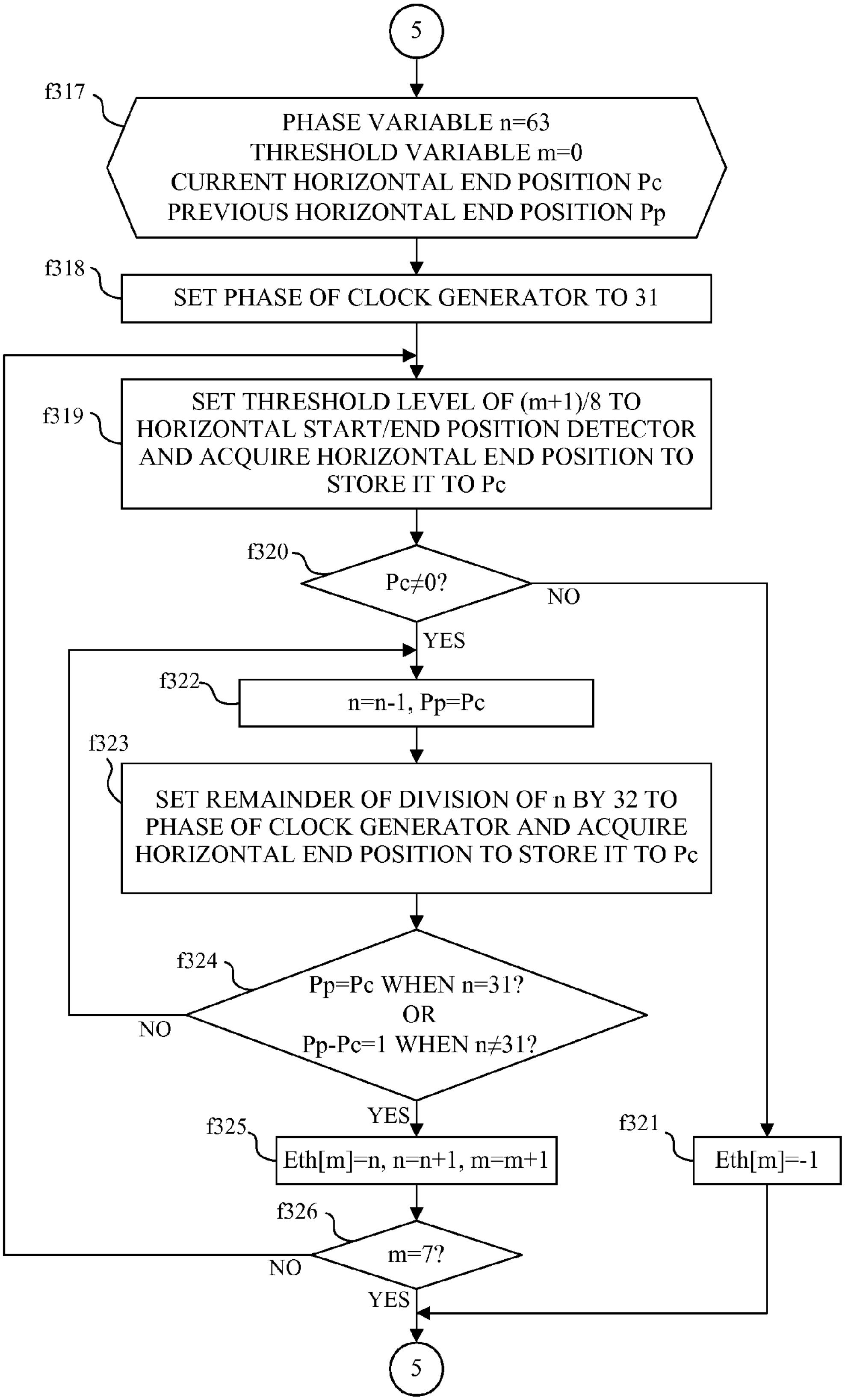

Next, detailed description will be made of operations in the end position change phase acquisition process (subroutine 5) with reference to FIG. 9C. The operations from step f317 to step f326 in the end position change phase acquisition process are different from those in the start position change phase acquisition process (subroutine 4) in that, since a level transition direction in the end position change phase acquisition process is reverse to that in the start position change phase acquisition process, the phase variable n is sequentially changed in a decreasing direction from an initial value of 63. Other operations in the end position change phase acquisition process are almost same as those in the start position change phase acquisition process, and therefore their description is omitted.

Figure 11A:
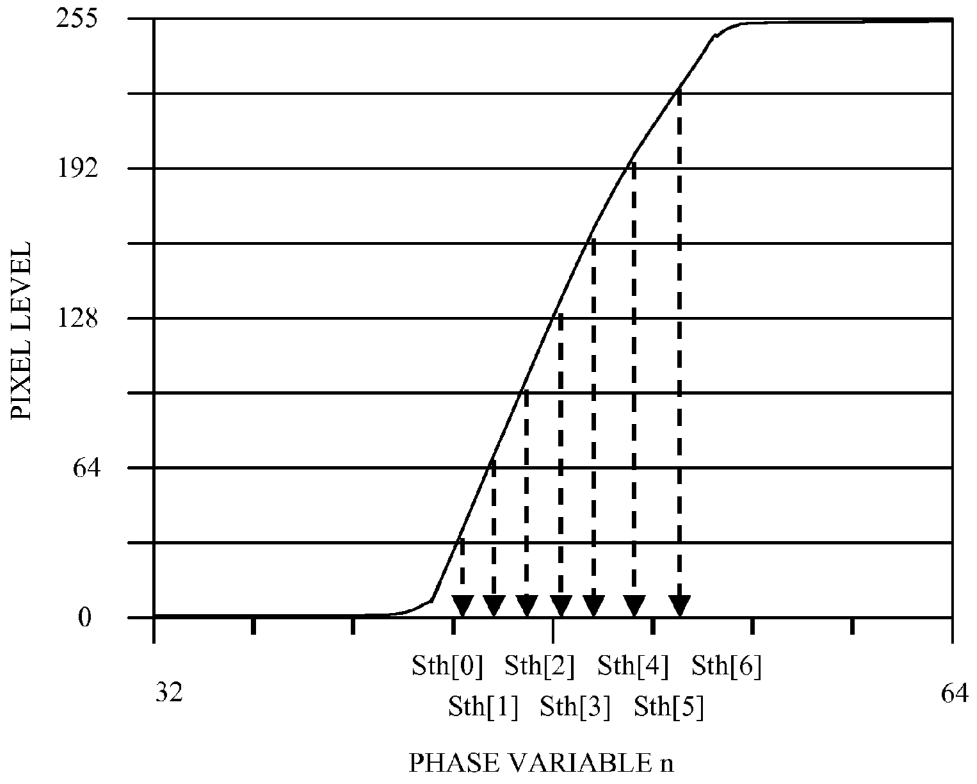
FIGS. 11A and 11B respectively show detection examples of the start position change phase and an end position change phase in Embodiment 3.
Figure 11B:
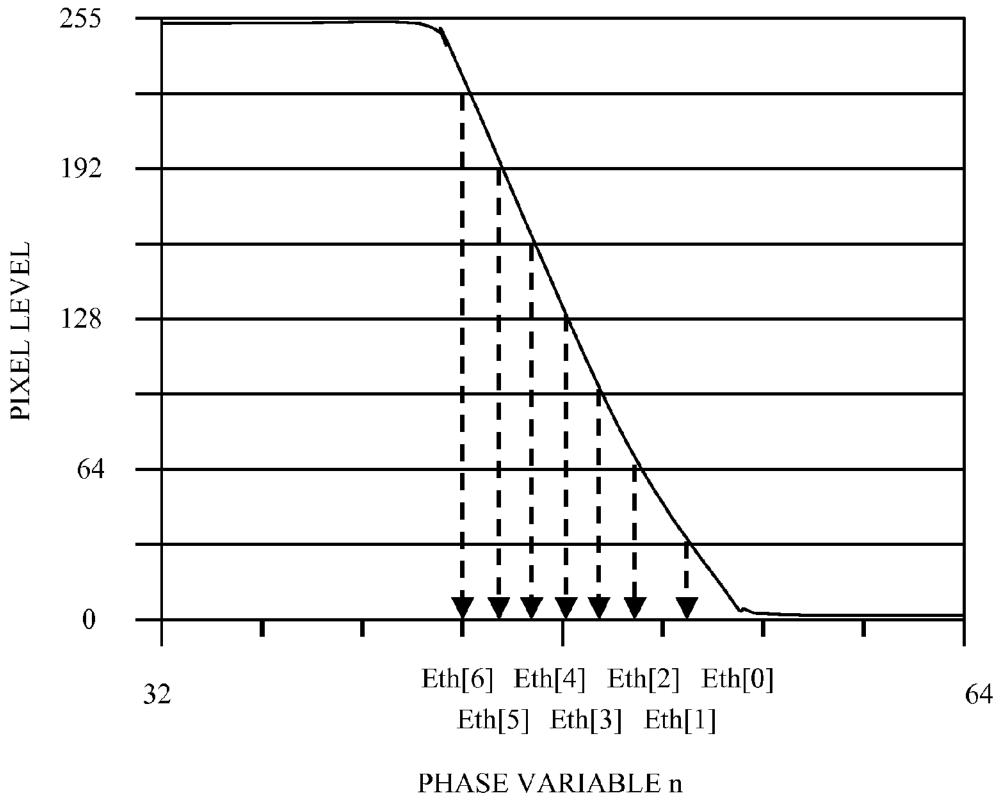

This process stores, to the end position change phase Eth[ ], the phases at which the analog video signal falls to at least two threshold levels in the transition from the high level to the low level. FIGS. 11A and 11B respectively show the start position change phase Sth[ ] and the end position change phase Eth[ ].

Figure 9D:
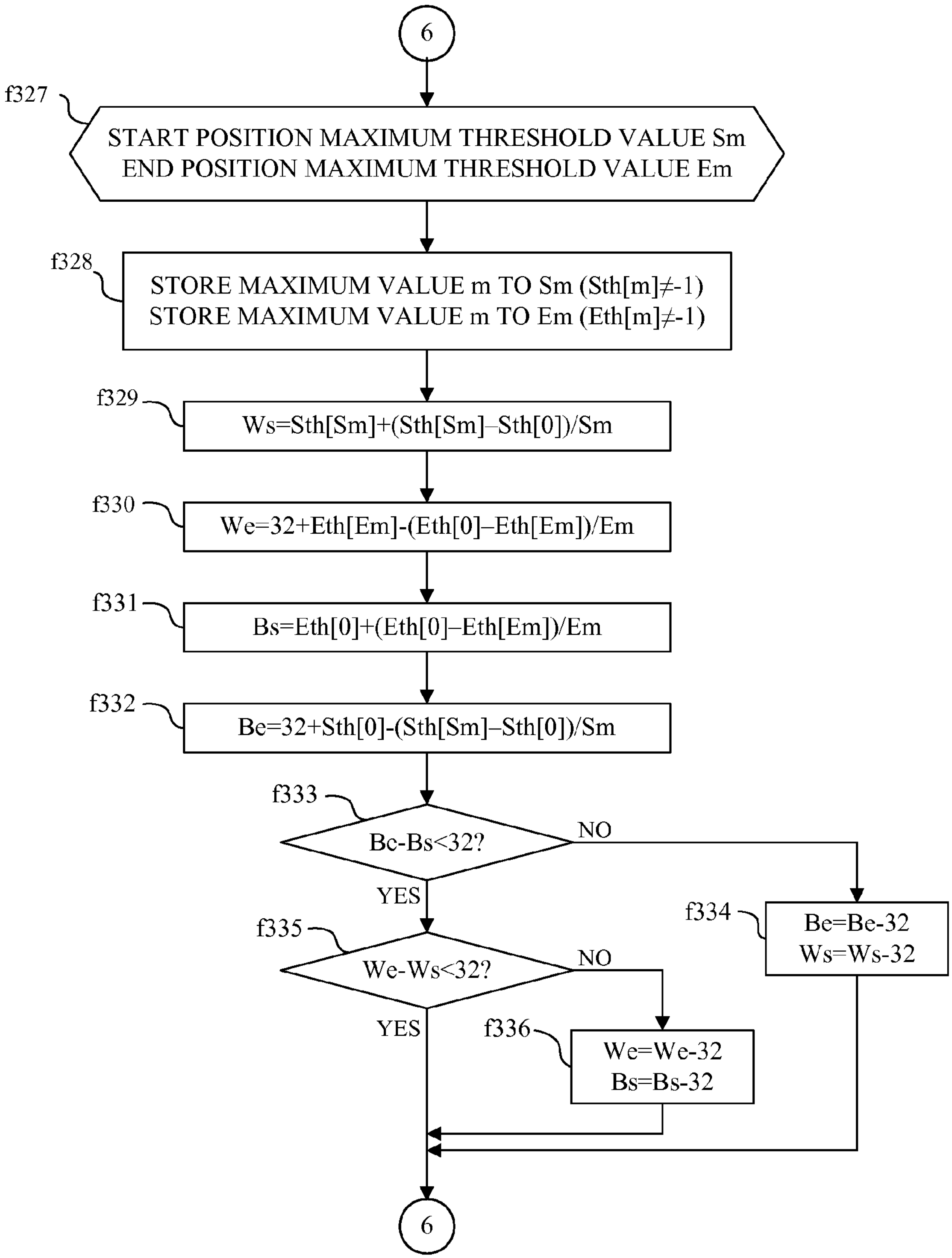

Next, detailed description will be made of operations in the white and black stable period calculation process b (Subroutine 6) with reference to FIG. 9D.

At step f327, the controller 1 defines various variables. A start position maximum threshold value Sm and an end position maximum threshold value Em respectively stores maximum values of the threshold levels corresponding to effective phases stored in the array elements of the start position change phase Sth[ ] and the end position change phase Eth[ ].

At step f328, the controller 1 respectively stores, to the start position maximum threshold value Sm and the end position maximum threshold value Em, maximum values of m by which Sth[m] and Eth[m] do not become −1.

At step f329, the controller 1 adds, to a phase Sth[Sm] at which the analog video signal rises to a maximum threshold level in the high-level transition, an approximate phase increased value (Sth[Sm]−Sth[0])/Sm corresponding to one threshold level transition. Then, the controller 1 sets the resulting phase Sth[Sm]+(Sth[Sm]−Sth[0])/Sm to the white stable period start position Ws.

Figure 12A:
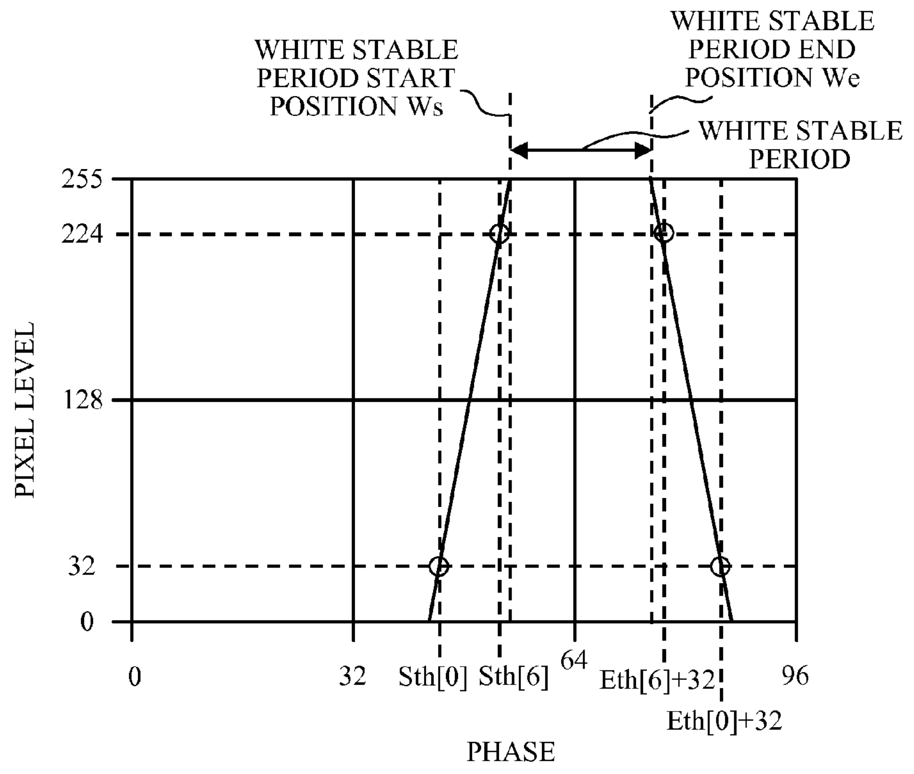
FIG. 12A shows an example of a transited waveform indicating a white stable period in Embodiment 3.

At step f330, the controller 1 subtracts, from a phase Eth[Em] at which the analog video signal falls to a maximum threshold level in the low-level transition, an approximate phase increased value (Eth[0]−Eth[Em])/Em corresponding to one threshold level transition. Then, the controller 1 adds 32 corresponding to one clock shift to the subtracted phase Eth[Em]−(Eth[0]−Eth[Em])/Em, and then sets the resulting phase 32+Eth[Em]−(Eth[0]−Eth[Em])/Em to the white stable period end position We. FIG. 12A shows an image of the white stable period.

At step f331, the controller 1 adds, to a phase Eth[0] at which the analog video signal falls to a minimum threshold level in the low-level transition, the approximate phase increased value (Eth[0]−Eth[Em])/Em corresponding to one threshold level transition. Then, the controller 1 sets the resulting phase Eth[0]+(Eth[0]−Eth[Em])/Em to the black stable period start position Bs.

Figure 12B:
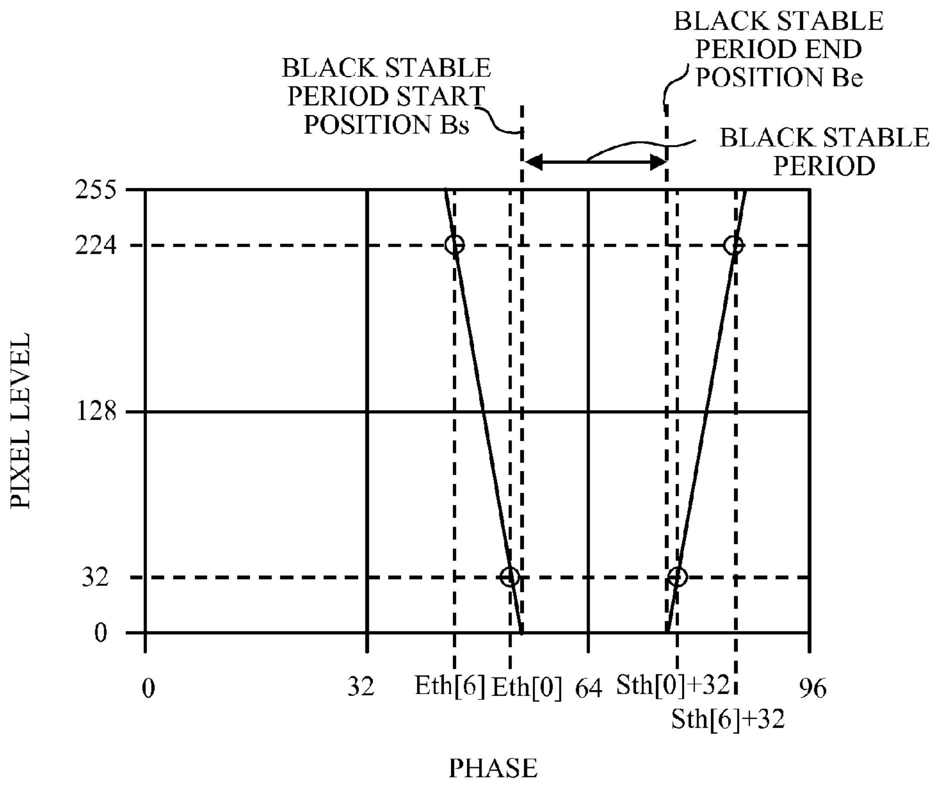
FIG. 12B shows an example of a transited waveform indicating a black stable period in Embodiment 3.
Figure 13:
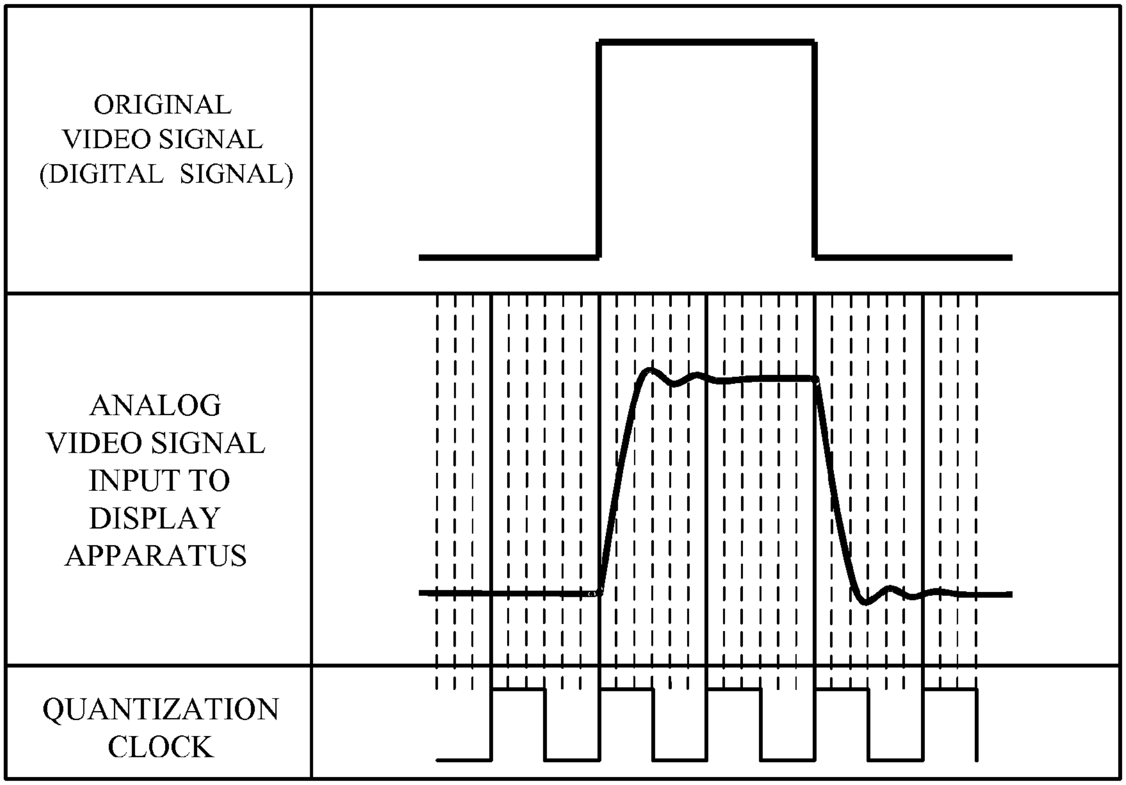
FIG. 13 shows an example of a video signal in which its high-level transition and its low-level transition start in a same phase.

At step f332, the controller 1 subtracts, from a phase Sth[0] at which the analog video signal rises to a minimum threshold level in the high-level transition, the approximate phase increased value (Sth[Sm]−Sth[0])/Sm corresponding to one threshold level transition. Then, the controller 1 adds 32 corresponding to one clock shift to the subtracted phase Sth[0]−(Sth[Sm]−Sth[0])/Sm, and then sets the resulting phase 32+Sth[0]−(Sth[Sm]−Sth[0])/Sm to the black stable period end position Be. FIG. 12B shows an image of the black stable period.

The above description was made assuming that the transition has ended when the phase is 0. However, if the transition is being continued when the phase is 0, there may exist a case where anteroposterior relationships of the transitions around the horizontal start coordinates and the horizontal end coordinates do not match each other. In order to compensate such a state, the controller 1 performs at steps f333 to f336 the same processes as those performed at steps f115 to f118 shown in FIG. 1C.

The above-described automatic quantization clock phase adjustment enables good quantization in the stable period after completion of each of the transitions from the black level to the high level and from the high level to the black level.

Although this embodiment used straight-line approximation between two points in the white and black stable period calculation process b (Subroutine 6), other approximation methods may be used.

Moreover, although this embodiment described the case of setting the midpoint of the phase period between the start and end positions of the overlap stable period as the appropriate phase in the appropriate phase calculation process (Subroutine 3), the appropriate phase may be any position in the phase period as long as the phase period has a sufficient margin.

Furthermore, an LPF may be provided as described in Embodiment 2, and in this case the appropriate phase may be set closer to the stable period end position than the midpoint.

In addition, each of Embodiments 1 to 3 described the case where a phase including the overlap period of the white and black stable periods is set as the appropriate phase. However, in a process similar to that in each of Embodiments 1 to 3, a phase including a phase period between the white stable period start position (first phase) and the white stable period end position (second phase) may be set to the appropriate phase, or a phase including a phase period between the black stable period start position (third phase) and the black stable period end position (fourth phase) may be set to the appropriate phase.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-013789, filed Jan. 26, 2010 which is hereby incorporated by reference herein in its entirety.

What is claimed is:

1. A method of automatically adjusting a phase of a quantization clock signal for a video signal based on a received analogue video signal, the method comprising the steps of:

- determining a first phase that corresponds to a stable-period start position and a second phase that corresponds to a stable-period end position at each transition associated with transitions of a pixel encoded in the analogue video signal by sequentially changing an adjustable phase of the quantization clock signal, the transitions occurring between high and low levels of the analogue video signal, the first phase being a phase at which a first transition from a low level to a high level is ended, and the second phase being a phase at which a second transition from the high level to the low level is started;
- calculating, as an appropriate phase of the quantization clock signal, a phase between the first phase and the second phase; and
- setting the phase of the quantization clock signal to the calculated appropriate phase.

2. A method according to claim 1, wherein the first phase and the second phase are determined based on a predetermined threshold.

3. A method according to claim 1, wherein the stable-period start and stable-period end positions are calculated using a straight-line approximation between two values of the analogue video signal, the two values of the analogue video signal being values of the analogue video signal at which the analogue video signal passes through respective predetermined thresholds.

4. A method according to claim 3, wherein the predetermined thresholds are values when the analogue video signal reaches 1/8 and 7/8 of its maximum value.

5. A method according to claim 1, further comprising the steps of:

- determining a third phase at which a third transition from the low level to the high level is started;
- determining a fourth phase at which a fourth transition from the high level to the low level is ended;
- determining an overlap period to calculate an overlap period start phase that is the more posterior one of the first and fourth phases and an overlap period end phase that is the more anterior one of the second and third phases, and
- wherein the appropriate phase of the quantization clock signal is calculated based on the mid-point of the overlap period.

6. A method according to claim 1, wherein the analogue video signal is passed through a low-pass filter before the aforementioned steps are performed, and

- wherein in the setting, the appropriate phase of the quantization clock is set closer to the stable period end position as the cutoff frequency is closer to the clock frequency.

7. A processing apparatus for automatically adjusting a phase of a quantization clock signal for a video signal based on a received analogue video signal, the apparatus comprising:

- a determining part configured to determine a first phase that corresponds to a stable-period start position and a second phase that corresponds to a stable-period end position at each transition associated with transitions of a pixel encoded in the analogue video signal by sequentially changing an adjustable phase of the quantization clock signal, the transitions occurring between high and low levels of the analogue video signal, the first phase being a phase at which a first transition from a low level to a high level is ended, and the second phase being a phase at which a second transition from the high level to the low level is started;
- a calculating part configured to calculate, as an appropriate phase of the quantization clock signal, a phase between the first phase and second phase; and
- a setting part configured to set the phase of the quantization clock signal to the calculated appropriate phase.

8. An apparatus according to claim 7, wherein the first phase and the second phase are determined based on a predetermined threshold.

9. An apparatus according to claim 7, wherein the determining part is configured to calculate the stable-period start and stable-period end positions using a straight-line approximation between two values of the analogue video signal, the two values of the analogue video signal being values of the analogue video signal at which the analogue video signal passes through respective predetermined thresholds.

10. An apparatus according to claim 9, wherein the determining part is configured so that the predetermined thresholds are values when the analogue video signal reaches 1/8 and 7/8 of its maximum value.

11. An apparatus according to claim 7, further comprising:

a second determining part configured to calculate a third phase at which a third transition from the low level to the high level is started and a fourth phase at which a fourth transition from the high level to the low level is ended;

a third determining part configure to calculate an overlap period to calculate an overlap period start phase that is the more posterior one of the first and fourth phases and an overlap period end phase that is the more anterior one of the second and third phases, and wherein the calculating part is configured to calculate the appropriate phase of the quantization clock signal based on the a mid-point of the overlapped period.

12. An apparatus according to claim 7, further comprising a low-pass filter arranged to process the received analogue video signal, and wherein in the setting, the appropriate phase of the quantization clock is set closer to the stable period end position as the cutoff frequency is closer to the clock frequency.

13. An apparatus according to claim 7, wherein the determining part is configured to acquire three pixel levels at each transition associated with the transitions of the pixel encoded in the analogue video signal when the determining part sets a particular phase.

14. A display apparatus comprising:

an AD converter configured to convert an analogue video signal into a digital video signal;

a phase adjuster configured to adjust a phase of a quantization clock in the AD converter with respect to the analogue video signal;

a horizontal start position detector configured to detect a horizontal start position that is a video start position in a video horizontal direction where an output value of the AD converter exceeds a threshold level;

a horizontal end position detector configured to detect a horizontal end position that is a video end position in the video horizontal direction where the output value of the AD converter exceeds the threshold level; and a threshold level adjuster configured to adjust the threshold level, wherein the phase adjuster is configured to perform a quantization clock phase adjustment process comprising the following processes:

a phase acquisition process to acquire, for each of at least two threshold levels and by sequentially changing an adjustable phase of the quantization clock, a start position change phase where the horizontal start position is changed and an end position change phase where the horizontal end position is changed;

a first phase calculation process to calculate a first phase where the analogue video signal ends its transition from a first level to a second level higher than the first level; and a second phase calculation process to calculate a second phase where the analogue video signal starts its transition from the second level to the first level, and the phase adjuster is configured to set, as the phase of the quantization clock, a phase included in a phase period between the first phase and the second phase.

15. A display apparatus according to claim 14, further comprising:

a third phase calculation process to calculate a third phase where the analogue video signal starts its transition from the first level to the second level;

a fourth phase calculation process to calculate a fourth phase where the analogue video signal ends its transition from the second level to the first level; and an overlap period calculation process to calculate an overlap period start phase that is the more posterior phase of the first and fourth phases and an overlap period end phase that is the more anterior phase of the second and third phases, and the phase adjuster is configured to set, as the phase of the quantization clock, a phase included in a phase period between the overlap period start phase and the overlap period end phase.

16. A display apparatus according to claim 14, further comprising:

a filter processor disposed in front of the AD converter and configured to perform a low-pass filter process, wherein the phase adjuster is configured to set, as the phase of the quantization clock, a phase closer to an end of the phase period as a cutoff frequency of the low pass filter process is closer to a frequency of the quantization clock.

* * * * *